US008198106B2

(12) United States Patent
Akinwande et al.

(10) Patent No.: US 8,198,106 B2
(45) Date of Patent: Jun. 12, 2012

(54) DENSE ARRAY OF FIELD EMITTERS USING VERTICAL BALLASTING STRUCTURES

(75) Inventors: Akintunde I. Akinwande, Newton, MA (US); Luis Fernando Velásquez-García, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 936 days.

(21) Appl. No.: 12/233,859

(22) Filed: Sep. 19, 2008

(65) Prior Publication Data

US 2009/0072750 A1 Mar. 19, 2009

Related U.S. Application Data

(60) Provisional application No. 60/973,543, filed on Sep. 19, 2007.

(51) Int. Cl.
*H01L 21/00* (2006.01)

(52) U.S. Cl. ................ 438/20; 438/48; 438/22; 257/10; 257/14; 257/296; 257/E23.074

(58) Field of Classification Search .................. 313/309, 313/336, 351; 257/10, 14, 296, E23.074; 438/20, 48, 22
See application file for complete search history.

(56) References Cited

U.S. PATENT DOCUMENTS 5,466,982 A 11/1995 Akinwande
6,392,355 B1 5/2002 Palmer et al.
6,448,701 B1 * 9/2002 Hsu ............................... 313/309
6,492,781 B2 12/2002 Palmer et al.
7,161,148 B1 1/2007 Givargizov et al.

FOREIGN PATENT DOCUMENTS

EP 0726589 8/1996

OTHER PUBLICATIONS

Minh et al., "Selective growth of carbon nanotubes on Si microfabricated tips and application for electron field emitters" J. Vac. Sci. Technol. Jul./Aug. 2003, pp. 1705-1709.
Takemura et al., "A Novel Vertical Current Limiter Fabricated with a Deep Trench Forming Technology for Highly Reliable Field Emitter Arrays" IEEE, 1997, pp. 29.1.1-29.1.4.
Velasquez-Garcia et al., "Uniform High Current Filed Emission of Electrons from Si and CNF FEAs Individually Controlled by Si Pillar Ungated FETs", IEEE Xplore, downloaded on Jan. 12, 2009, pp. 599-602.
Velasquez-Garcia et al., "Fabrication of large arrays of high-aspect-ratio single-crystal silicon columns with isolated vertically aligned multi-walled carbon nanotube tips" 2008 IOP Publishing Ltd., pp. 1-6.

* cited by examiner

*Primary Examiner* — Evan Pert
*Assistant Examiner* — Mark A Laurenzi
(74) *Attorney, Agent, or Firm* — Gesmer Updegrove LLP

(57) ABSTRACT

A field emitter array structure is provided. The field emitter array structure includes a plurality of vertical un-gated transistor structures formed on a semiconductor substrate. The semiconductor substrate includes a plurality of vertical pillar structures to define said un-gated transistor structures. A plurality of emitter structures are formed on said vertical un-gated transistor structures. Each of said emitter structures is positioned in a ballasting fashion on one of said vertical un-gated transistor structures so as to allow said vertical ungated transistor structure to effectively provide high dynamic resistance with large saturation currents.

21 Claims, 28 Drawing Sheets

DENSE ARRAY OF FIELD EMITTERS USING VERTICAL BALLASTING STRUCTURES

PRIORITY INFORMATION

This application claims priority from provisional application Ser. No. 60/973,543 filed Sep. 19, 2007, which is incorporated herein by reference in its entirety.

SPONSORSHIP INFORMATION

This invention was made with government support awarded by the United States Air Force under Contract No. FA9550-06-C-0058 and also the United States Army under Contract No. W911QY-05-1-0002. The government has certain rights in the invention

BACKGROUND OF THE INVENTION

The invention is related to the field of field emitter arrays, and in particular to dense arrays of field emitters using vertical ballasting structures. Each field emitter uses a vertical ballasting structure.

Electrons are field emitted from the surface of metals and semiconductors when the potential barrier that holds electrons within the material is deformed by the application of a high electrostatic field. Typically high surface electrostatic fields are obtained by the application of a voltage between a gate structure and a high aspect ratio structure with nanometer scale tip radius which usually has Gaussian or log-normal distribution. Due to the exponential dependence on tip radius, emission currents are extremely sensitive to tip radii variation. Consequently, only a small fraction of the tips in an array emit electrons when sufficient voltage is applied between the gate structure and the emitters. Attempts to increase the emission current by increasing the voltage often result in burnout and shifting of the operating voltage to higher voltages. Therefor; it is difficult to obtain uniform or high currents from field emitter arrays (FEAs). Spatial non-uniformity can be substantially reduced if the emitters are ballasted as demonstrated in the past with groups of emitters.

The use of large resistors in series with the field emitters is an unattractive ballasting approach because of the resulting low emission currents and power dissipation in the resistors.

SUMMARY OF THE INVENTION

According to one aspect of the invention, there is provided a field emitter structure. The field emitter structure includes a vertical un-gated transistor structure formed on a semiconductor substrate. The semiconductor substrate includes a vertical pillar structure to define said un-gated transistor structure. An emitter structure is formed on said vertical un-gated transistor structure. The emitter structure is positioned in a ballasting fashion on the vertical un-gated transistor structure so as to allow said un-gated field effect transistor structure to effectively provide high dynamic resistance with large saturation currents.

According to another aspect of the invention, there is provided a field emitter array structure. The field emitter array structure includes a plurality of vertical un-gated transistor structures formed on a semiconductor substrate. The semiconductor substrate includes a plurality of vertical pillar structures to define said un-gated transistor structures. A plurality of emitter structures are formed on said vertical un-gated transistor structures. Each of said emitter structures is positioned in a ballasting fashion on one of said vertical un-gated transistor structures so as to allow said vertical un-gated transistor structures to effectively provide high dynamic resistance with large saturation currents.

According to another aspect of the invention, there is provided a method of forming a field emitter array structure. The method includes forming a plurality of vertical un-gated transistor structures on a semiconductor substrate. The semiconductor substrate includes a plurality of vertical pillar structures to define said un-gated transistor structures. Also, the method includes forming a plurality of emitter structures on said vertical un-gated transistor structures. Each of said emitter structures is positioned in a ballasting fashion on one of said vertical un-gated transistor structures so as to allow said vertical un-gated transistor structures to effectively provide high dynamic resistance with large saturation currents.

DETAILED DESCRIPTION OF THE INVENTION

The invention provides the first dense ($10^6$ emitters/cm$^2$) high current (10 mA) array of individually ballasted field emitters that use un-gated field effect transistors (FETs) as current limiters.

Figure 1:
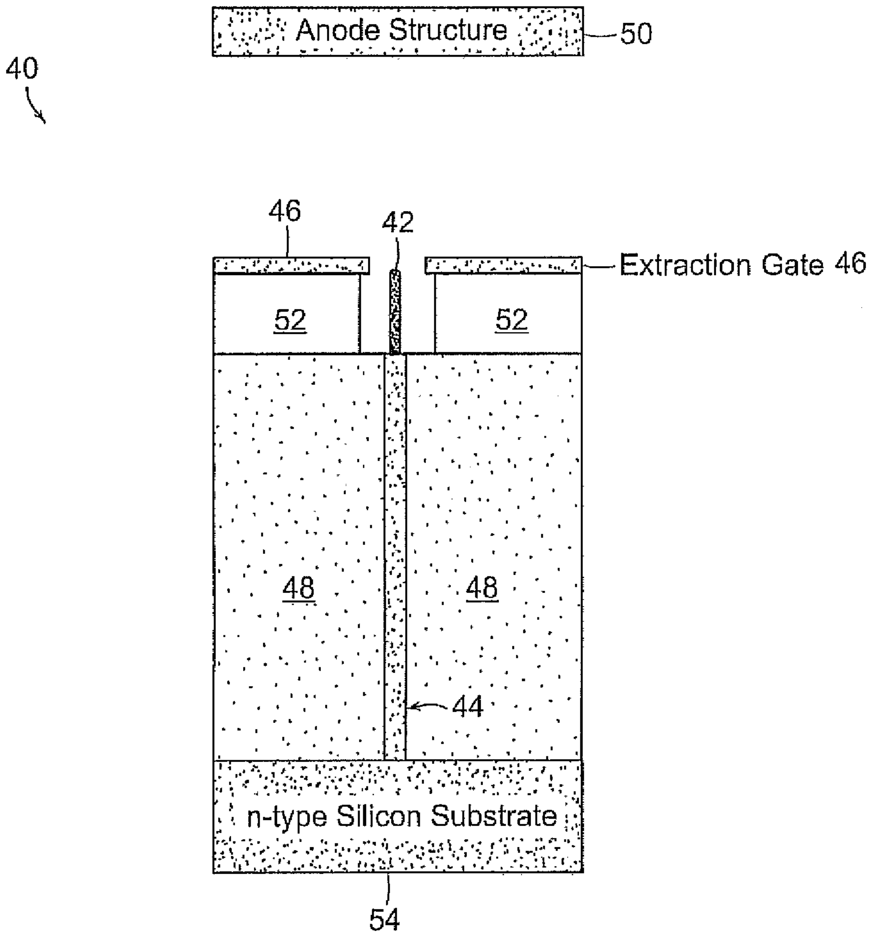
FIG. 1 is a schematic diagram an inventive field emitter structure.

FIG. 1 show a field emitter structure individually ballasted with an un-gated field effect transistor 40 formed in accordance with the invention. The field emitter structure individually ballasted with an un-gated field effect transistor includes an anode 50 and a field emitter 42 being defined by a sharp tip made of metal, semiconductor or any other conducting material individually ballasted by a current source, which in this case is implemented by a semiconductor column/pillar un-gated field effect transistor (FET) 44 made on an substrate 54, which is a n-type silicon substrate but other similar materials can be used. The field emitter is preferably self-aligned though not absolutely necessary to annular extraction gates 46 that are close proximity. The un-gated FET 44 includes high aspect ratio (>10) semiconductor column whose current is limited by the saturation velocity of electrons or holes in the semiconductor. In this embodiment of the invention, the field emitter 42 includes silicon or carbon nanotubes/fibers and the un-gated FET 44 includes silicon, however, other similar materials can be used. The un-gated FET 44 and the field emitter 42 are connected in series to prevent current runaway or burn-out. The un-gated FET 44 is positioned between insulating layers 48. The extraction gates 46 are positioned on insulating layers 52. The insulating layers 52 are positioned on insulating layers 48. The insulating layers 48 and 52 can include silicon dioxide or other oxide materials.

Using the structure 40 of FIG. 1, one can form a high current array structure using a plurality of the structures described in FIG. 1.

Figure 2:
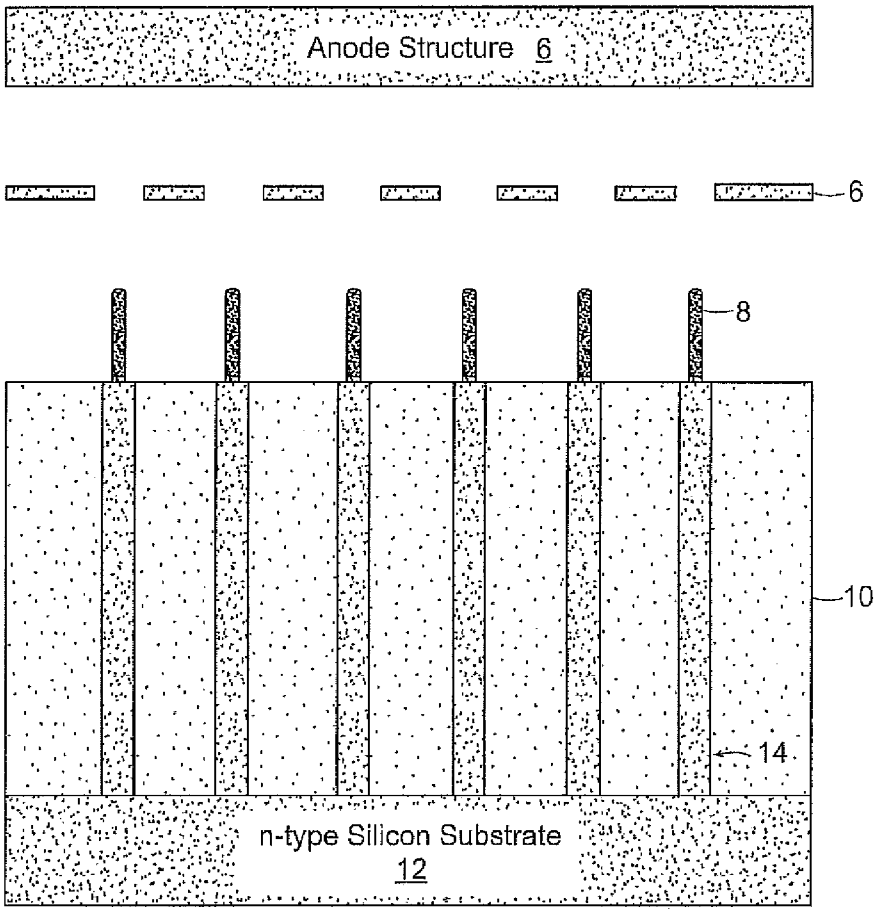
FIG. 2 is a schematic diagram illustrating the inventive field emitter array (FEA) structure.

FIG. 2 shows the inventive high current array structure 2 of individually ballasted field emitters 8 that use un-gated field effect transistors. The high current array structure 2 includes an anode structure 4 and a multitude of screen gates 6. Each silicon or carbon nanofiber (CNF) emitter 8 is individually connected in series with a vertical silicon pillar un-gated FET 14 or current limiter and each is separated by a multitude of fill trenches 10 made in an n-type silicon substrate 12. The filled trenches can include silicon dioxide or other oxide based materials. The un-gated FET 14 takes advantage of the saturation of carrier velocity in silicon to obtain current source-like behavior required for uniform and high current operation.

Figure 3B:
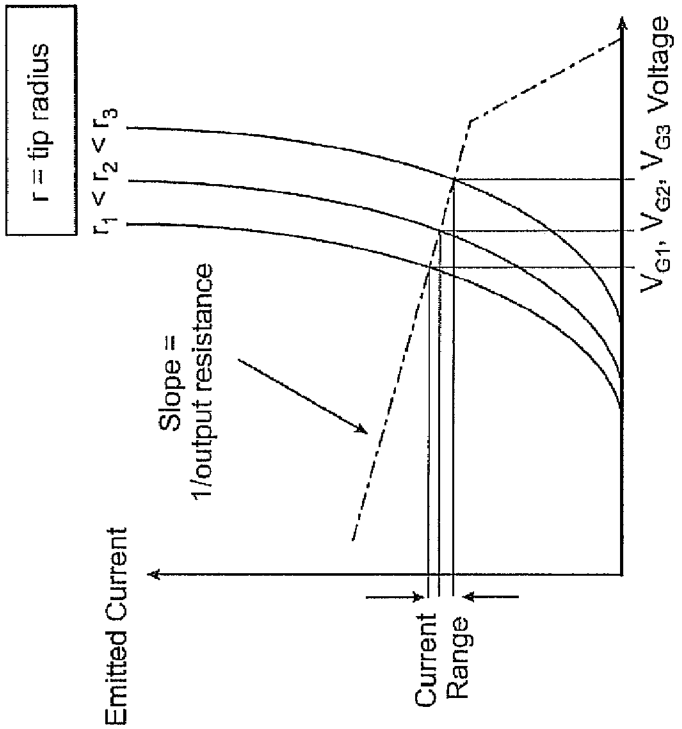
FIGS. 3A-3B are graphs illustrating ballasting of FEAs using resistors and the invention respectively.
Figure 3A:
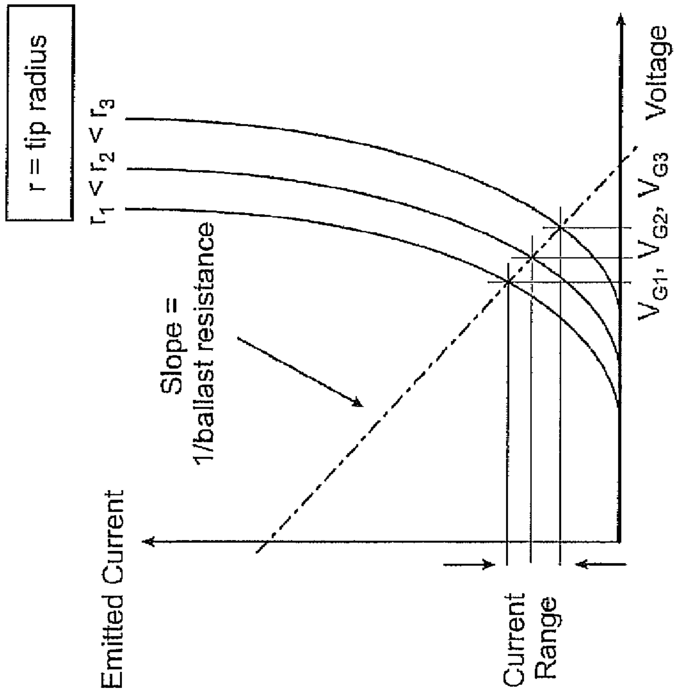

Attempts to increase the emission current in conventional field emitter arrays by increasing the voltage often result in burnout and shifting of the operating voltage to higher voltages. Therefore, it is difficult to obtain uniform or high currents from field emitter arrays (FEAs). Spatial non-uniformity can be substantially reduced if arrays of emitters are ballasted as demonstrated in the past. However, ballasting of individual emitters has not been attempted due to fabrication complexity. Ballasting individual emitters would prevent destructive emission from the sharper tips while allowing higher overall current emission because of emission of duller tips. The use of large resistors in series with the field emitters is an unattractive ballasting approach because of the resulting low emission currents and large power dissipation in the resistors, as shown in FIG. 3A. Metal Oxide Semiconductor Field Effect Transistor (MOSFETs) can ballast the emission of FEAs, but this approach is unable to yield high density FEAs because the MOSFETs consume considerable area if implemented as individual ballasts. A better approach for ballasting field emitters is the use of the invention where vertical un-gated field effect transistors effectively provide high dynamic resistance with large saturation currents as shown in FIG. 3B.

Figure 4:
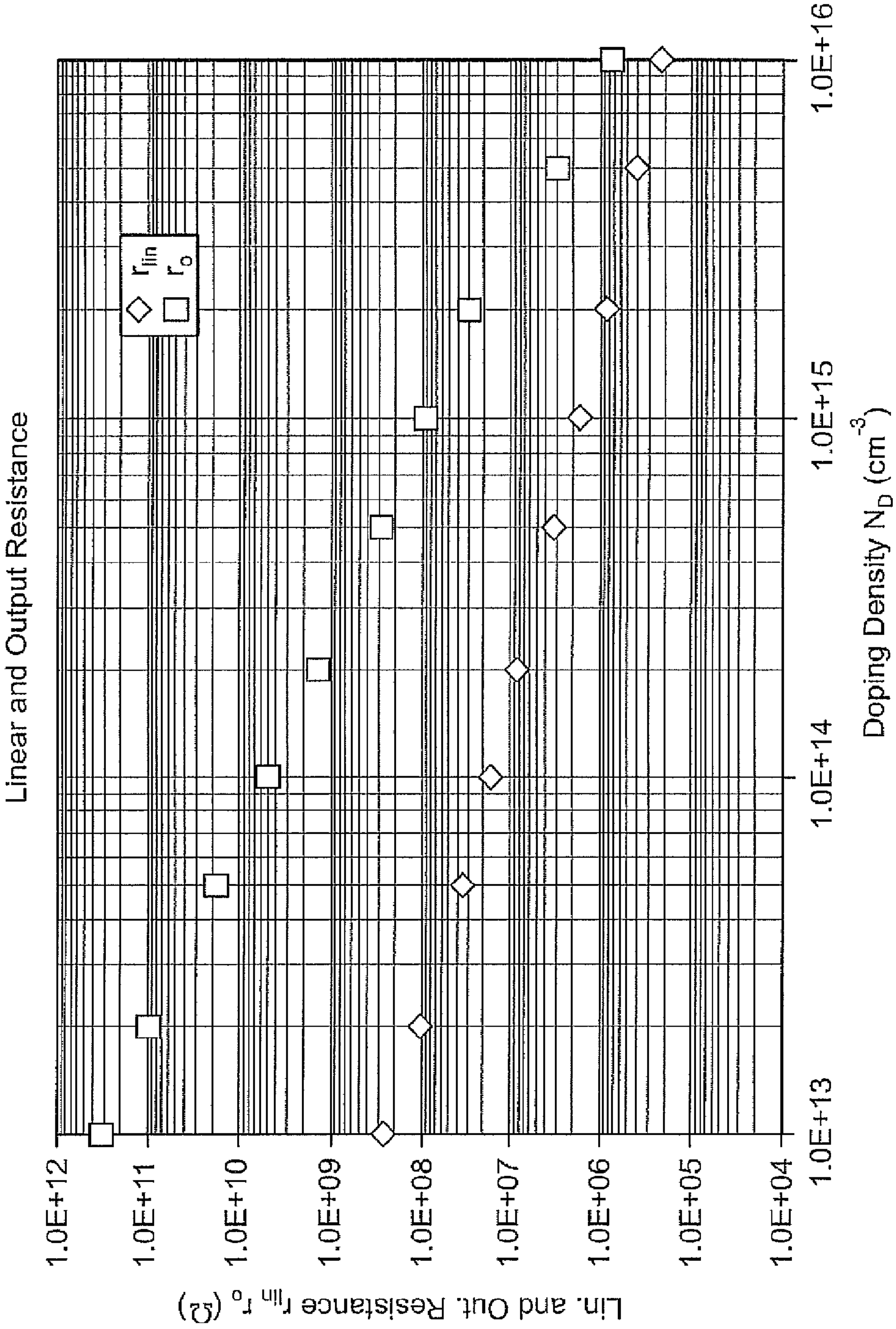
FIG. 4 is a graph illustrating the linear input and output resistance in association with the doping concentration of the inventive silicon un-gated field effect transistor (FET)
Figure 5:
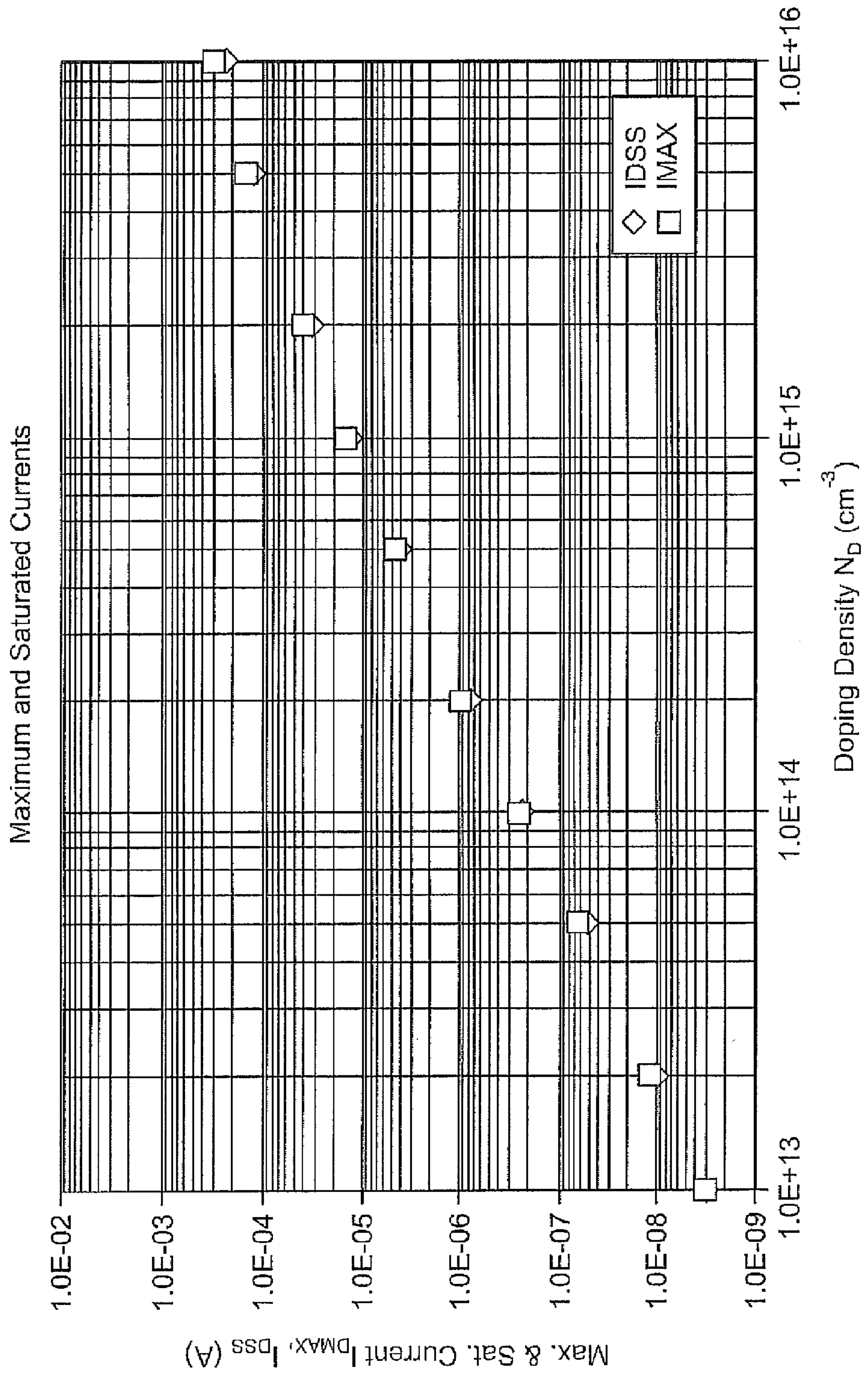
FIG. 5 is a graph illustrating the relationship between the inventive silicon column (pillar) un-gated field effect transistor (FET) and doping concentration.
Figure 6:
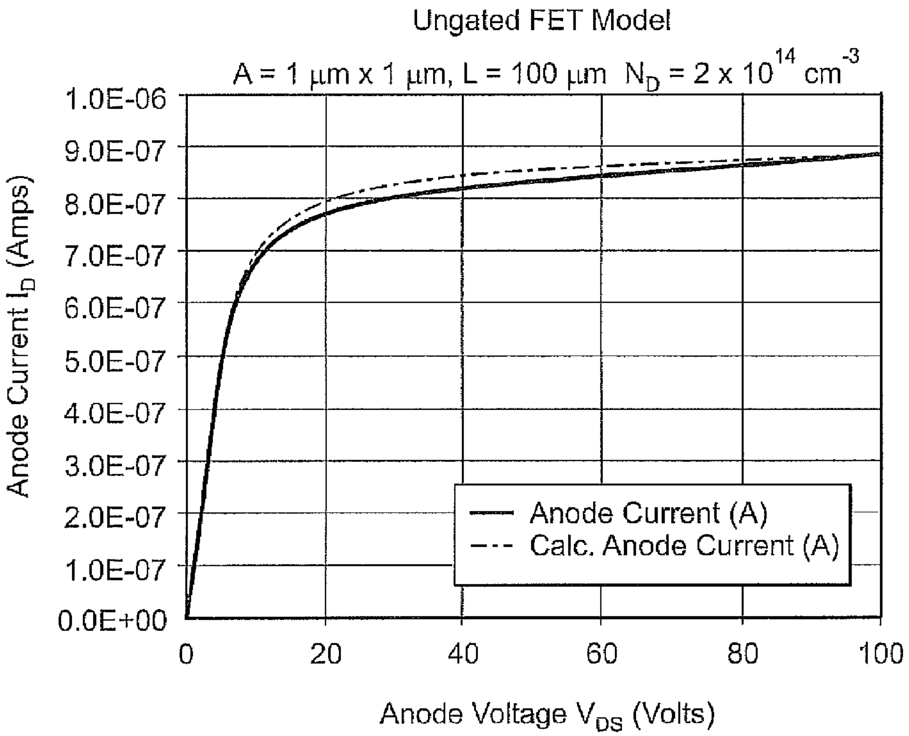
FIG. 6 is graph illustrating the current voltage characteristics of the inventive un-gated FET showing a numerical simulation and an analytical model that matches the simulation.

A model is used to quantify emission current sensitivity of field emitters to tip radii and work function variation. The model also examined the influence of ballasting by resistors and un-gated FETs on emission current variation. Based on this analysis, parameters for the un-gated FET were calculated using information shown in FIGS. 4-5. Structural parameters of the un-gated FET were determined through process and device simulations that explored channel doping between $10^{13}$ cm$^{-3}$ and $10^{16}$ cm$^{-3}$ and channel length between 10 μm and 100 μm with a cross-section area of 1 μm×1 μm. Current source-like behavior is obtained because of velocity saturation at high fields, as shown in FIG. 6.

Figure 7:
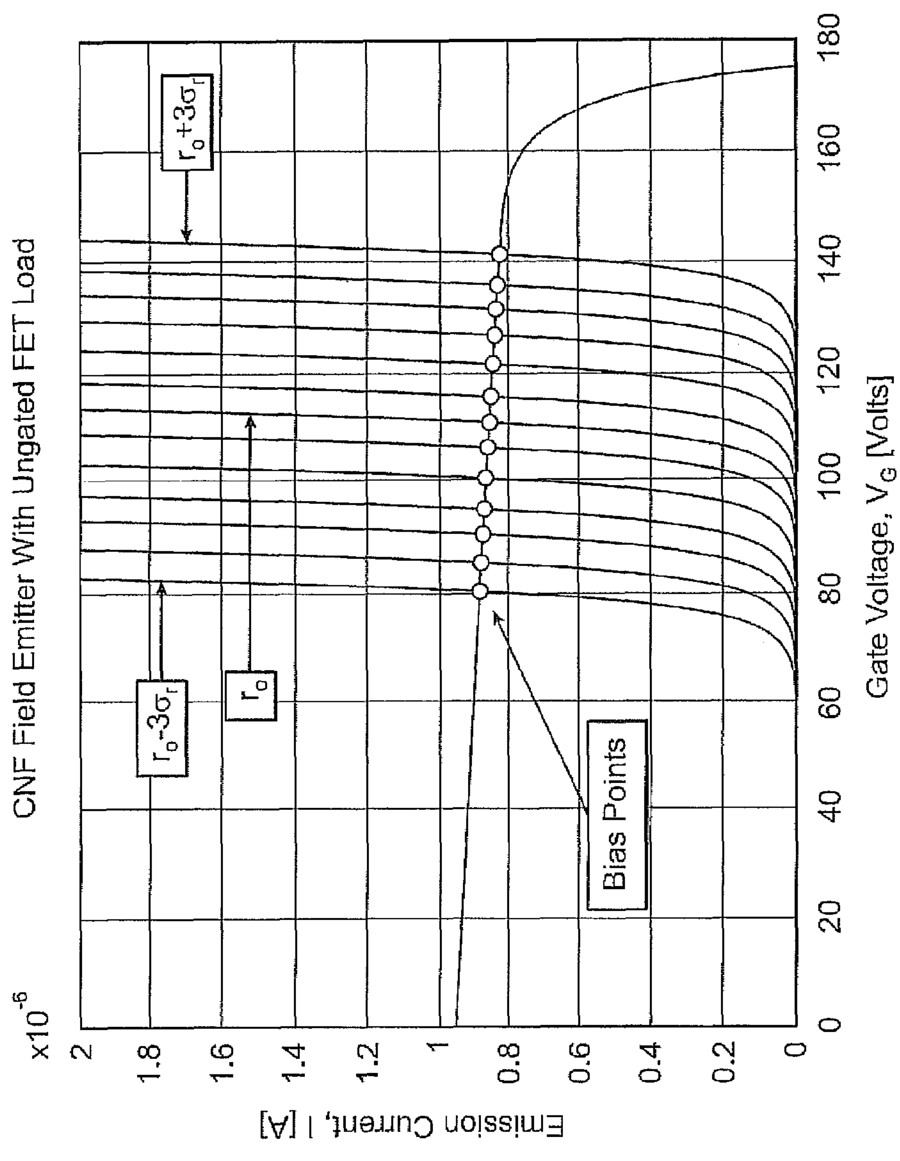
FIG. 7 is a graph illustrating a simulation of how the inventive array of field emitters individually ballasted with the un-gated field effect transistor makes the emission current uniform despite variation in the tip radii of the field emitters.
Figure 8:
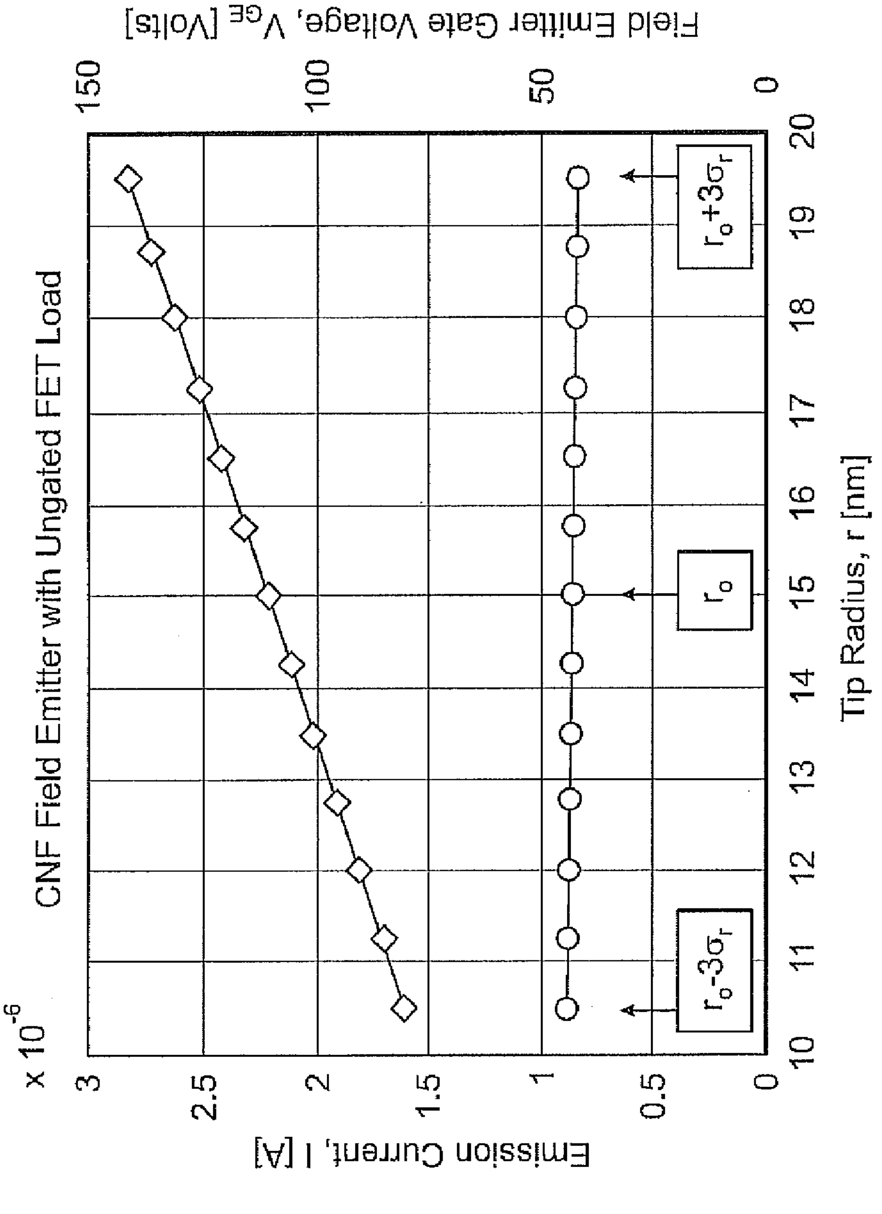
FIG. 8 is a graph illustrating a simulation demonstrating how the of the inventive array of field emitters individually ballasted with the un-gated field effect transistor makes the emission current uniform despite variation in the tip radii of the field emitters.

The simulated IV characteristics of the un-gated FET closely matches the proposed analytical model:

$$I_D = g_{LIN} V_{DS}\left[1 + \frac{V_{DS}}{V_A}\right] \Big/ \sqrt{1 + \left(\frac{V_{DS}}{V_{DSS}}\right)^2} \quad (1)$$

where $I_D$ is the drain current, $g_{LIN}$ is the linear conductance, $V_{DS}$ is the drain-to-source voltage, $V_{DSS}$ is the drain-to-source saturation voltage (velocity saturation), and $V_A$ is the Early voltage (channel length modulation). Simulation of the field emitter integrated with the un-gated FET show that the emission current could be maintained within 5% of the target value for a 6-σ tip radii variation, as shown in FIGS. 7-8.

Figure 9A:
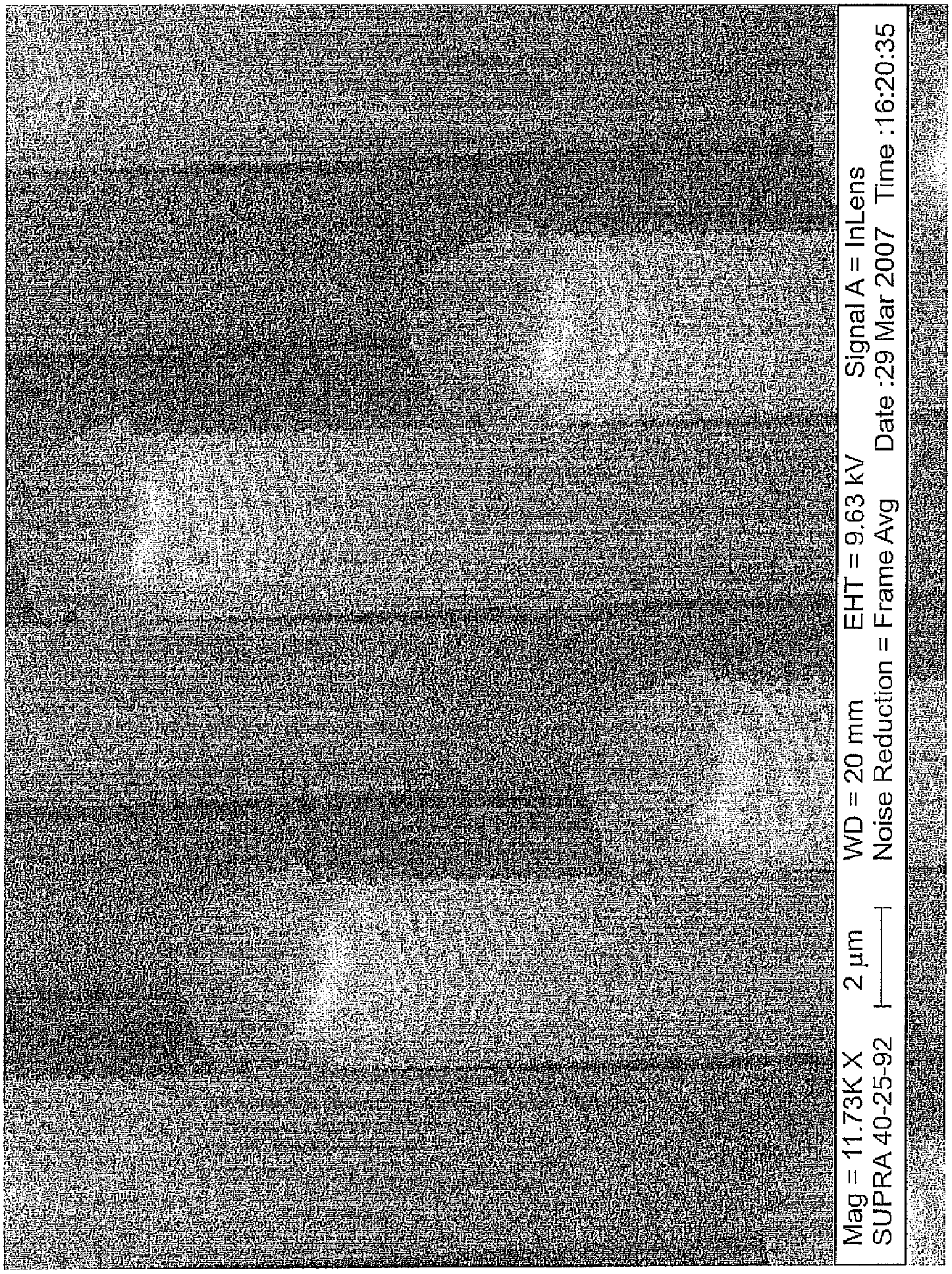
FIGS. 9A-9B are scanning electron micrographs (SEM) diagrams illustrating the fabrication of the un-gated FETs.
Figure 9B:
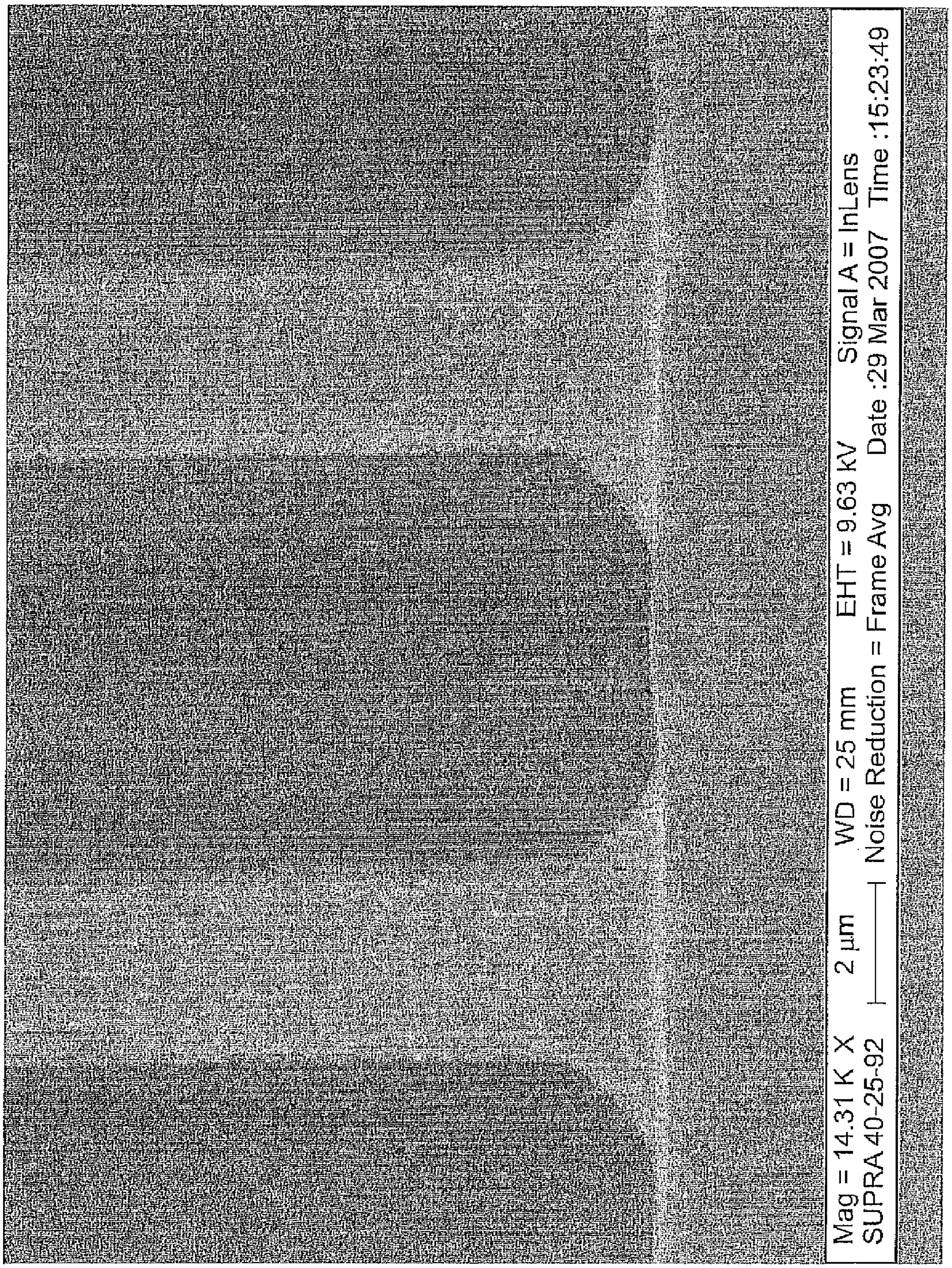
Figure 10:
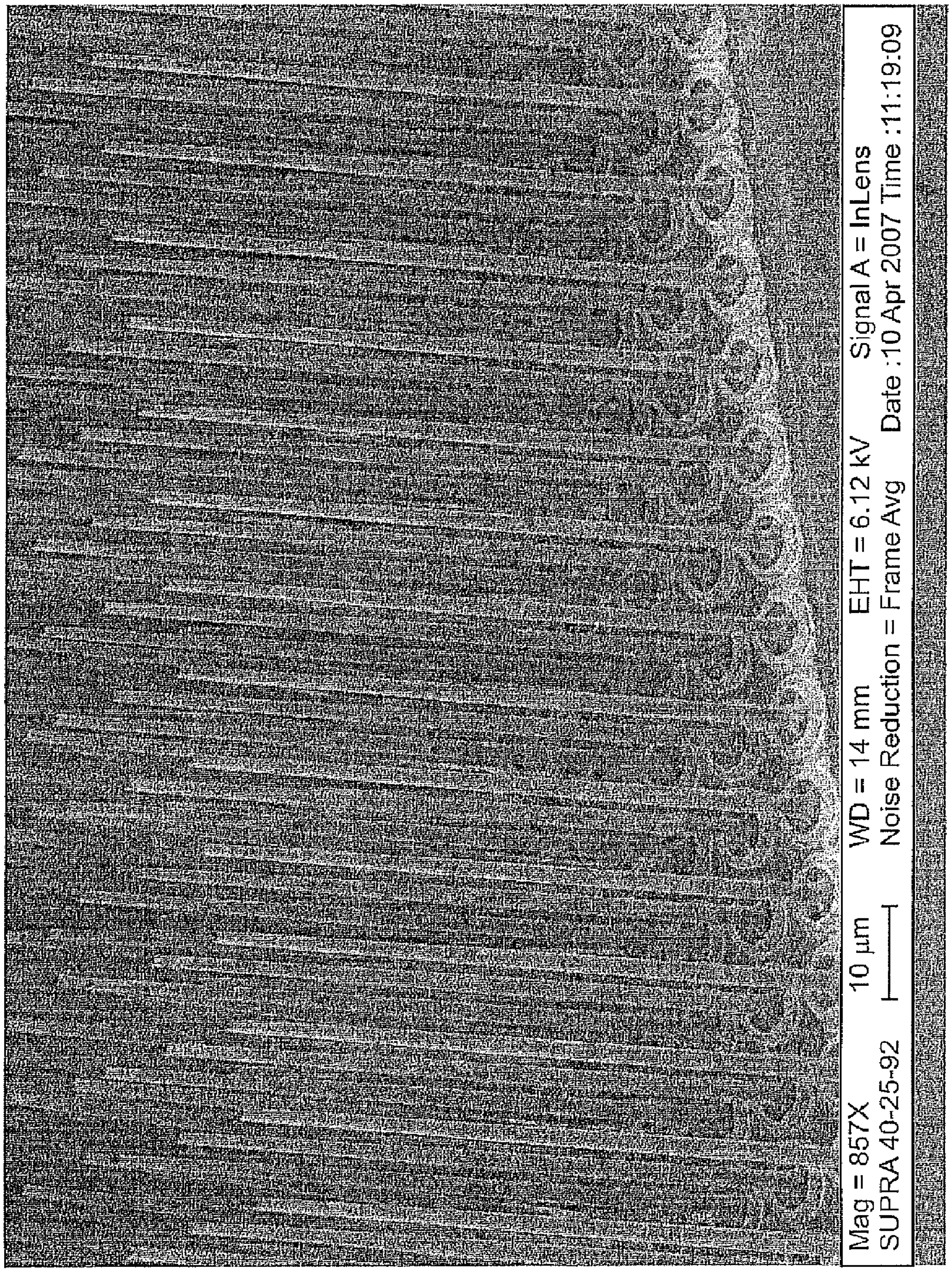
FIG. 10 is a SEM diagram illustrating Si pillar thinning of the un-gated FETs.

Un-gated FETs were fabricated on n-Si by depositing a dielectric thin film stack (0.5 μm PECVD $SiO_2$/0.5 μm LPCVD silicon-rich silicon nitride/0.5 μm thermal $SiO_2$), followed by contact photolithography, RIE of the thin film stack, DRIE of the n-Si, as shown in FIG. 9, wet oxidation, and HF release in special chamber, as shown in FIG. 10. In particular, FIG. 10 shows the fabrication of the un-gated FETs—Si Pillar thinning. Wet oxidation is used to reduce the width of the columns. Columns are 100 μm tall and less than 1.0 μm wide. HF vapors are used to remove the thermal oxide.

Figure 11A:
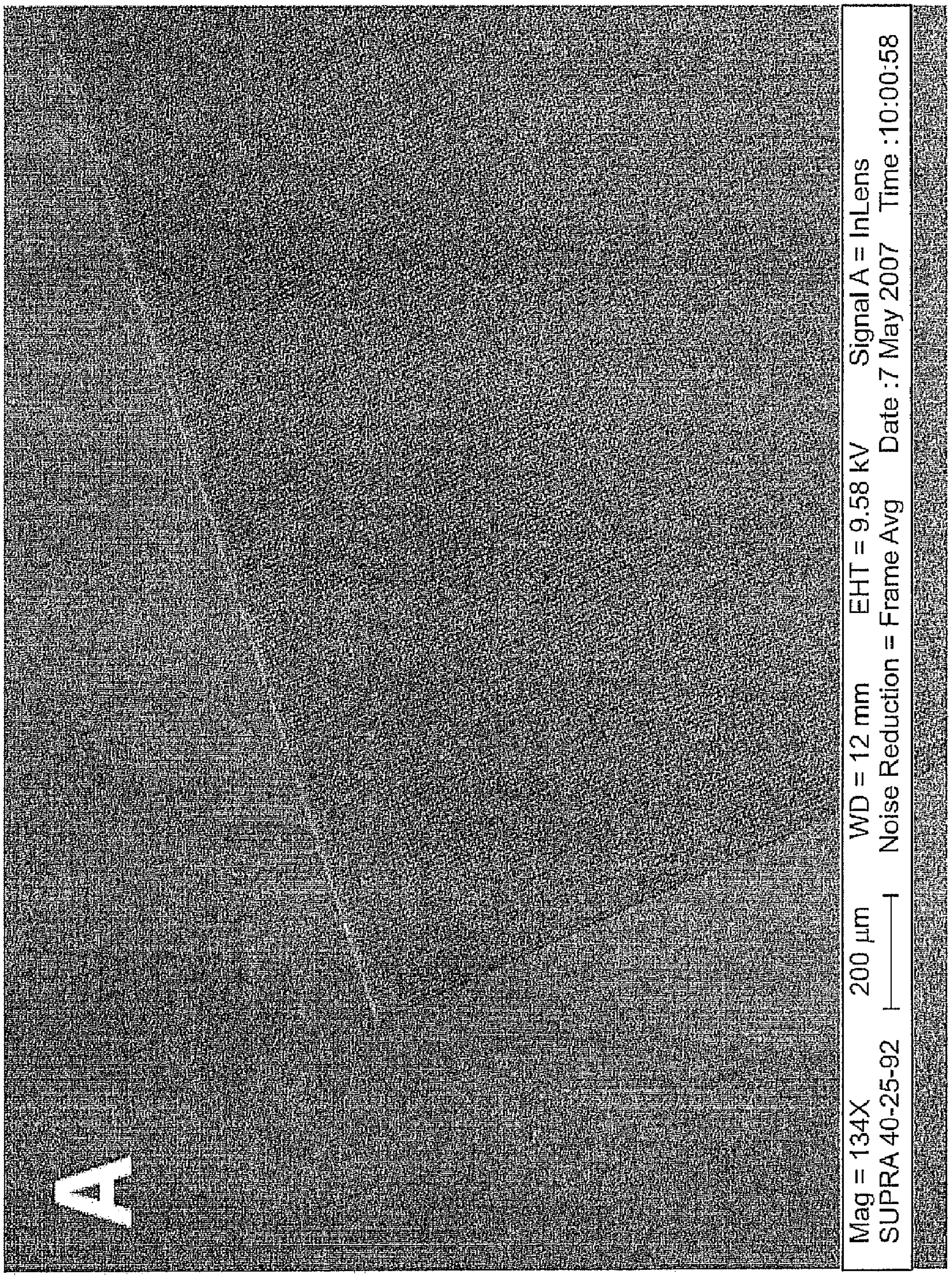
FIGS. 11A-11D are SEM diagrams illustrating the fabrication of Si tips in a FEAs.
Figure 11B:
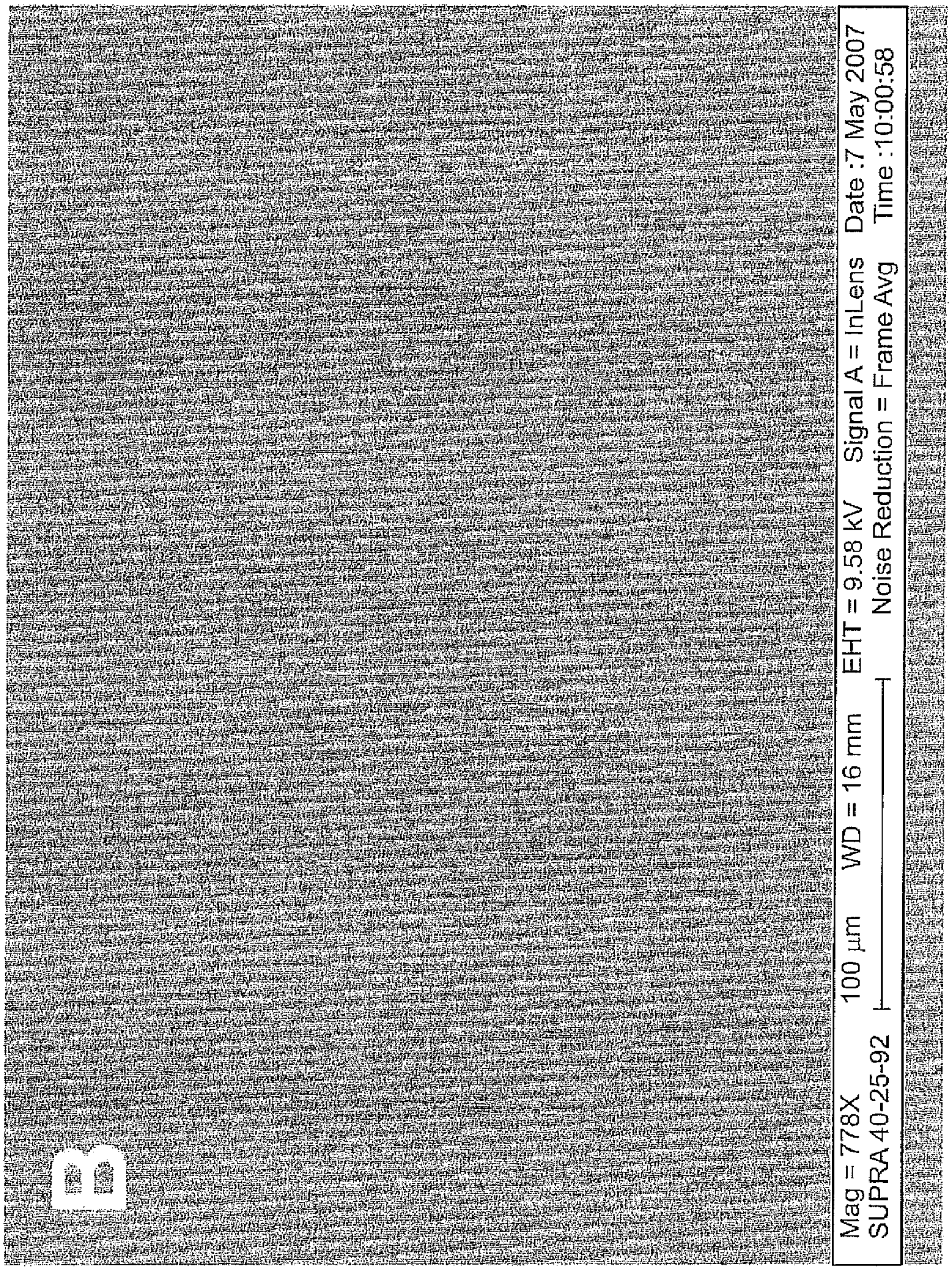
Figure 11C:
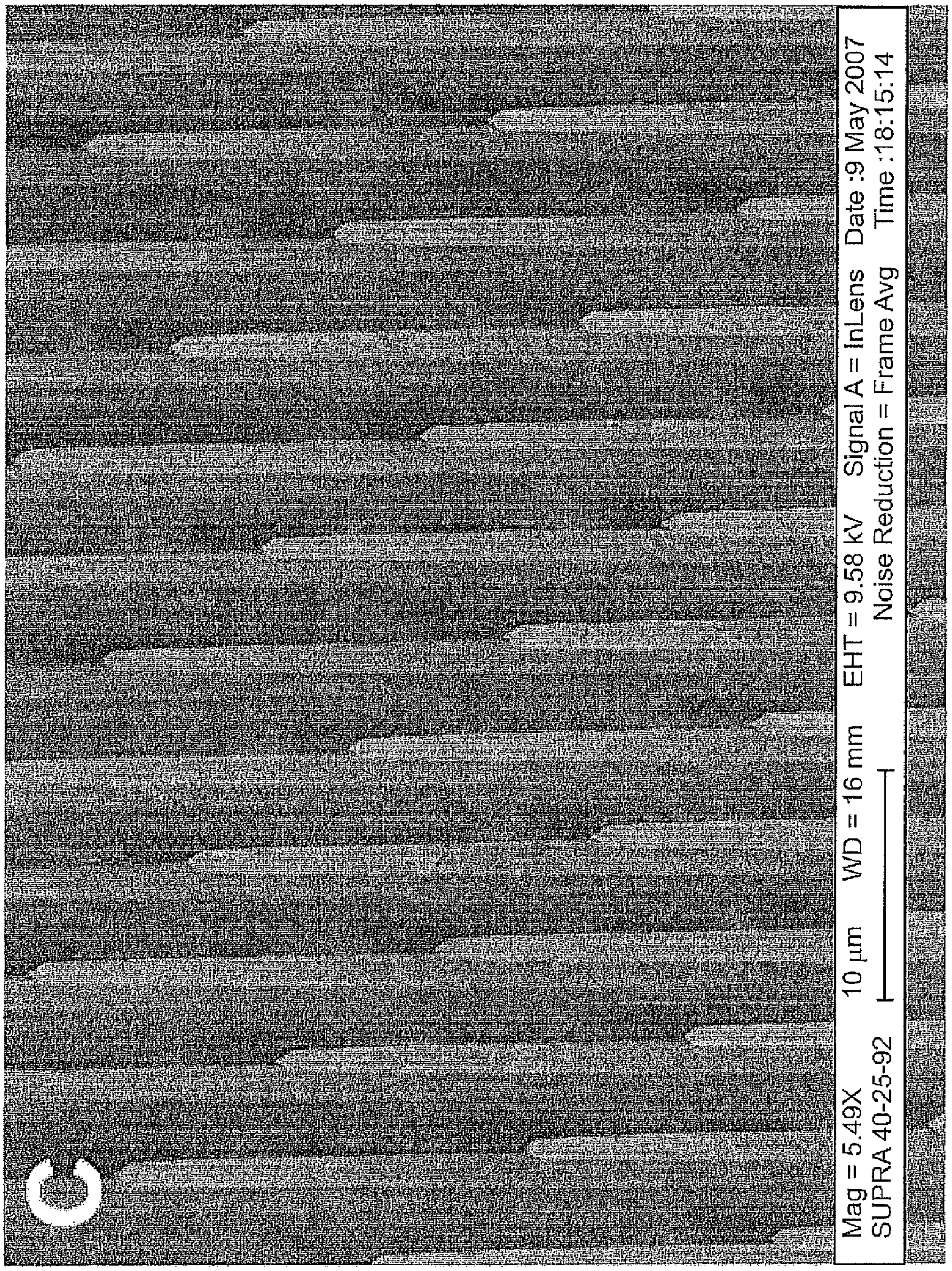
Figure 11D:
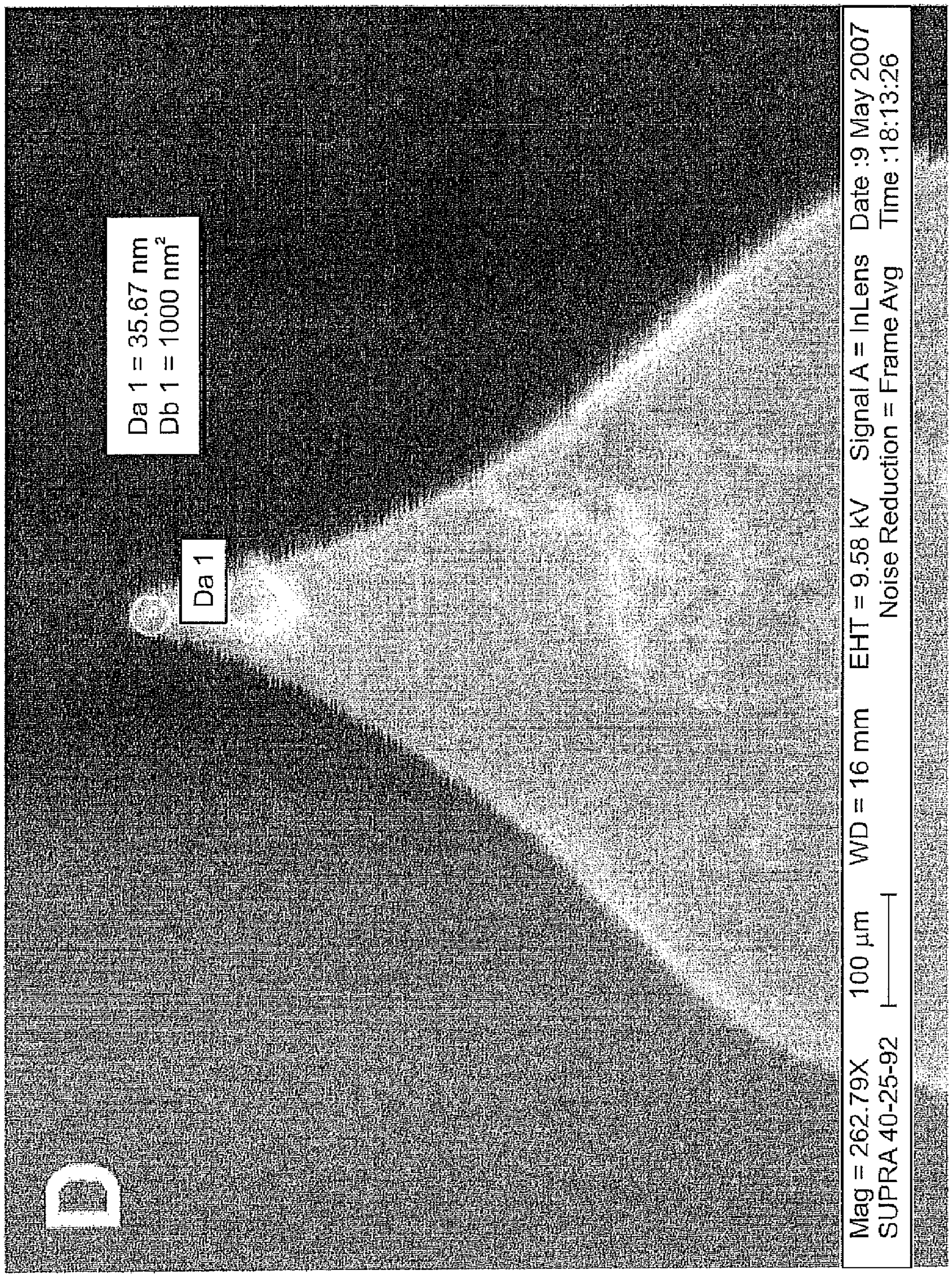

FIGS. 11A-11D shows the fabricated Si FEAs, and in particular FIG. 11A shows a 1 cm×1 cm Si FEA on top of 100 μm-tall silicon columns, 10 μm column pitch and FIG. 11B shows the zoom of the Si FEA. FIG. 11C shows a few Si field emitter on top of un-gated FETs. FIG. 11D shows a Si tip with tip diameter equal to 35 nm. The Si FEAs were fabricated by modifying the DRIE step of the un-gated FET, tip sharpening occurs at the oxidation step, as shown FIGS. 11A-11D.

Figure 12A:
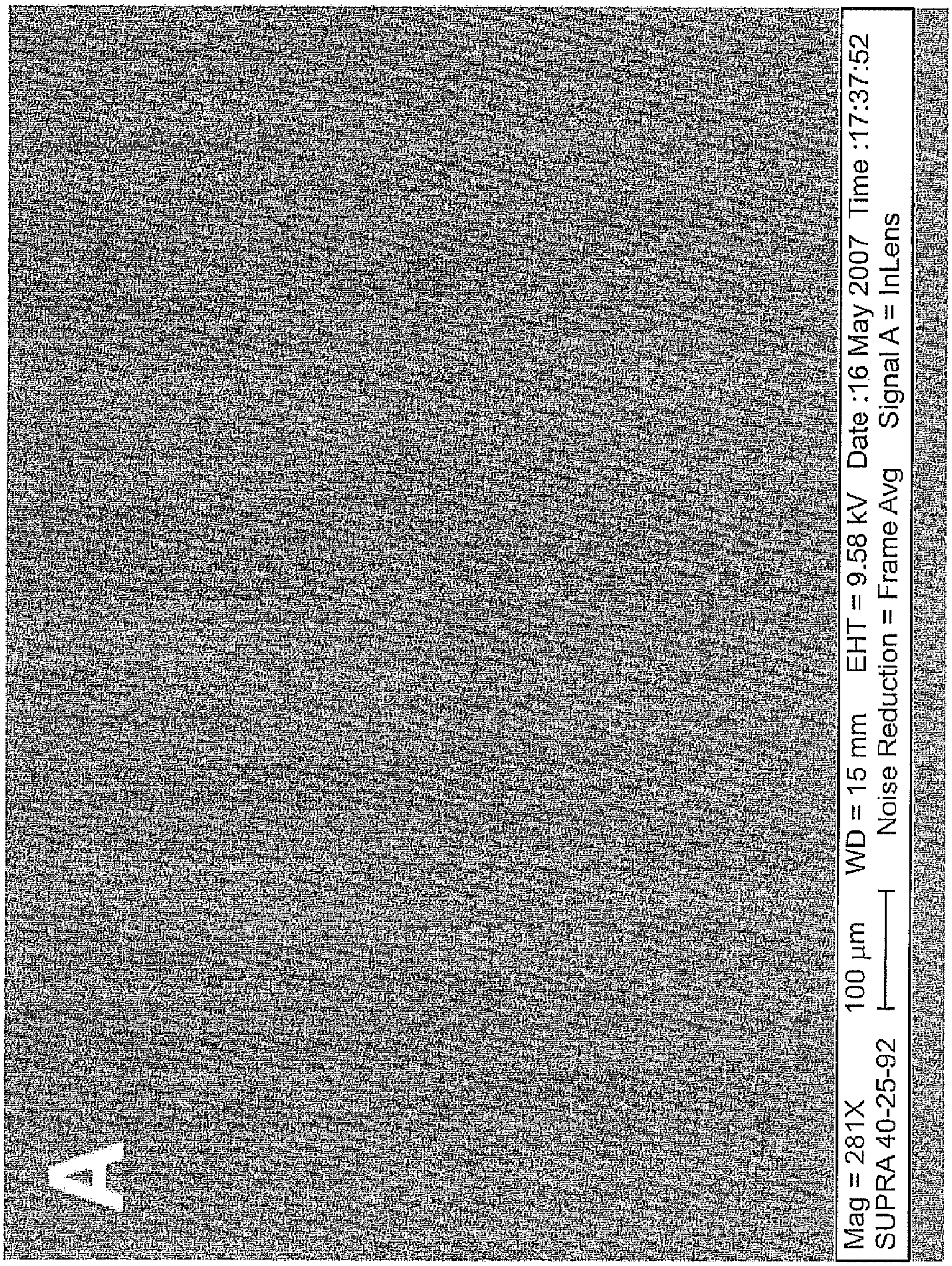
FIGS. 12A-12D are SEM diagrams illustrating the fabrication of carbon nanotubes/fibers (CNTs/CNFs) FEAs.
Figure 12B:
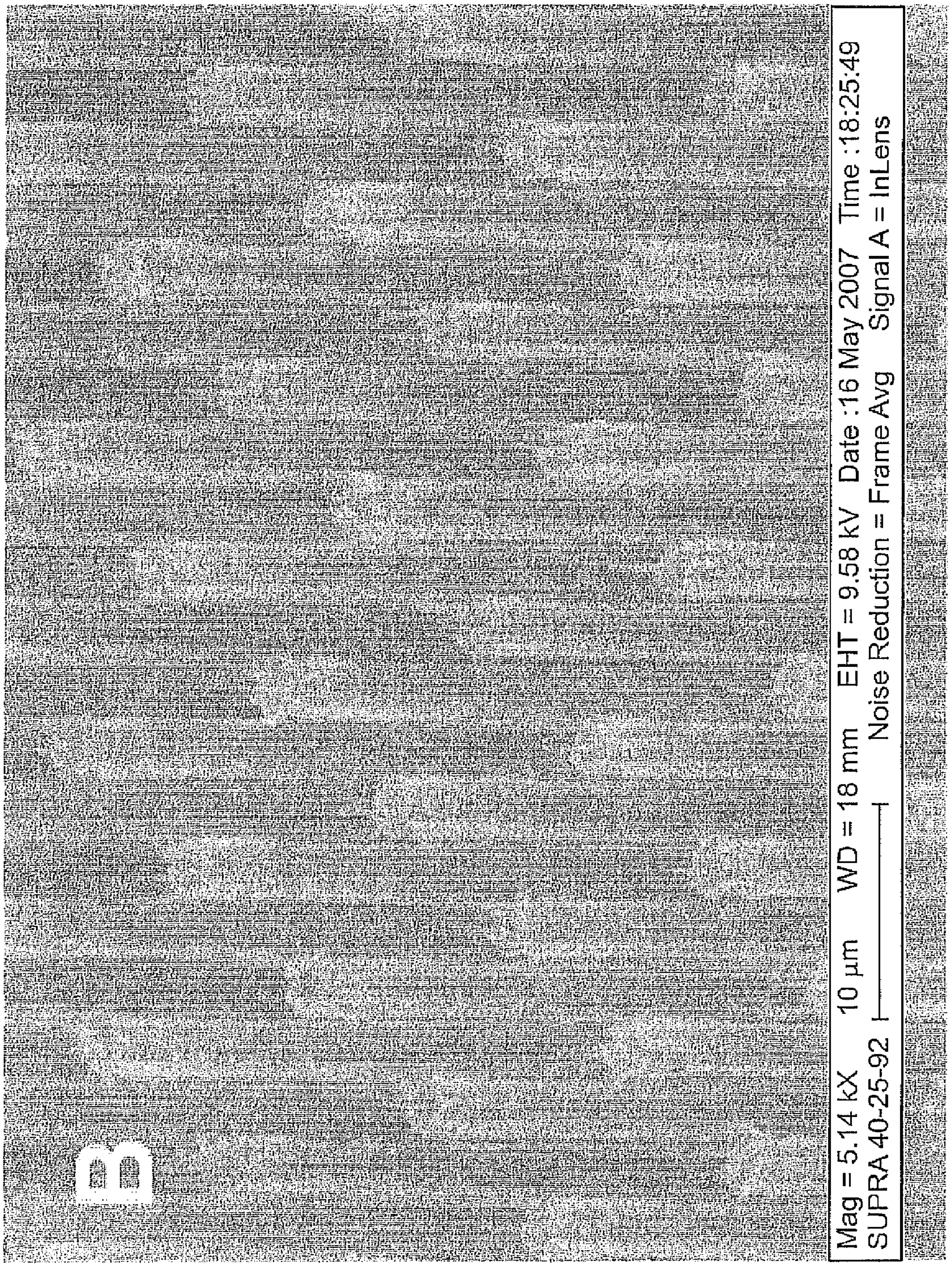
Figure 12C:
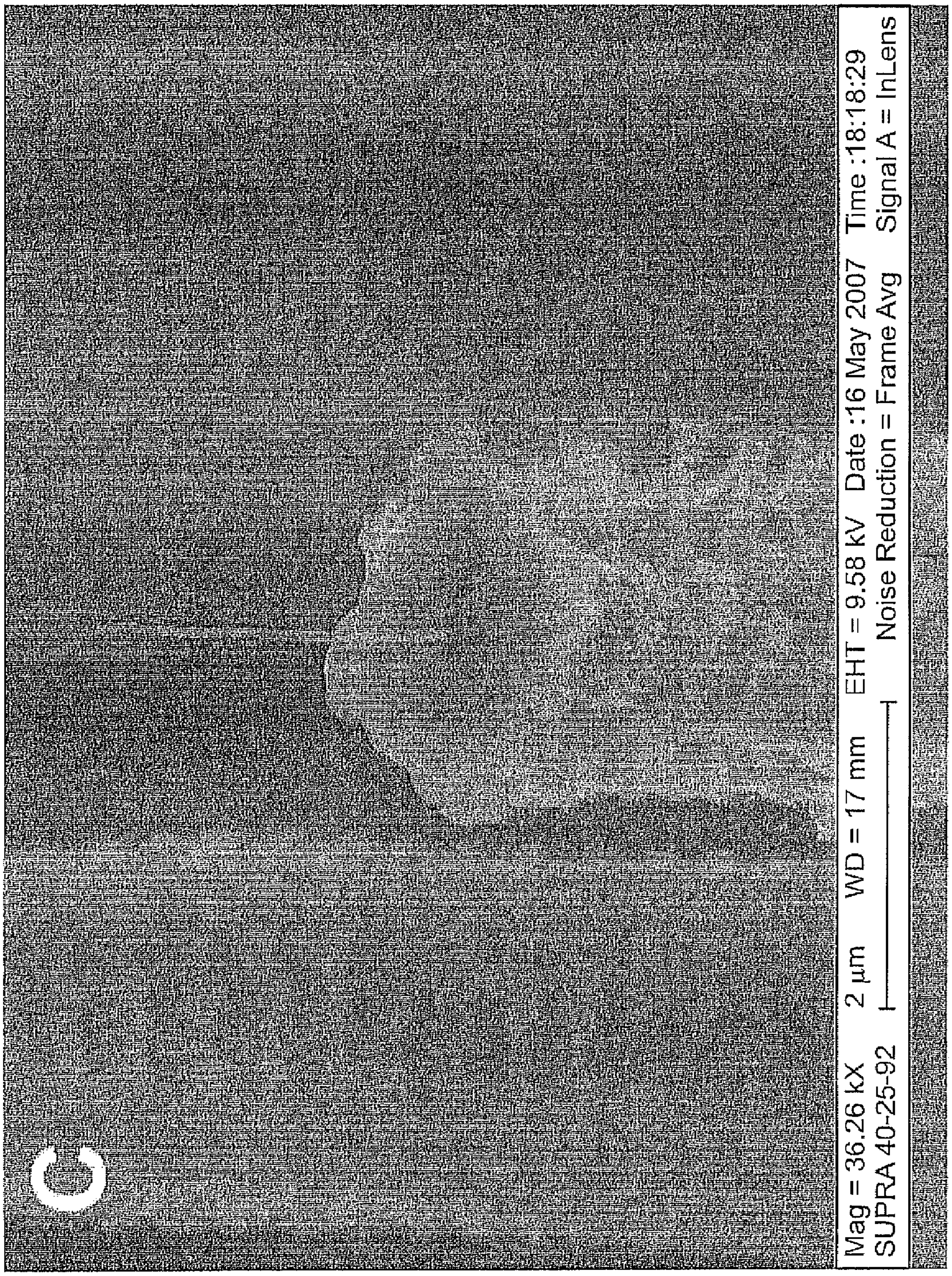
Figure 12D:
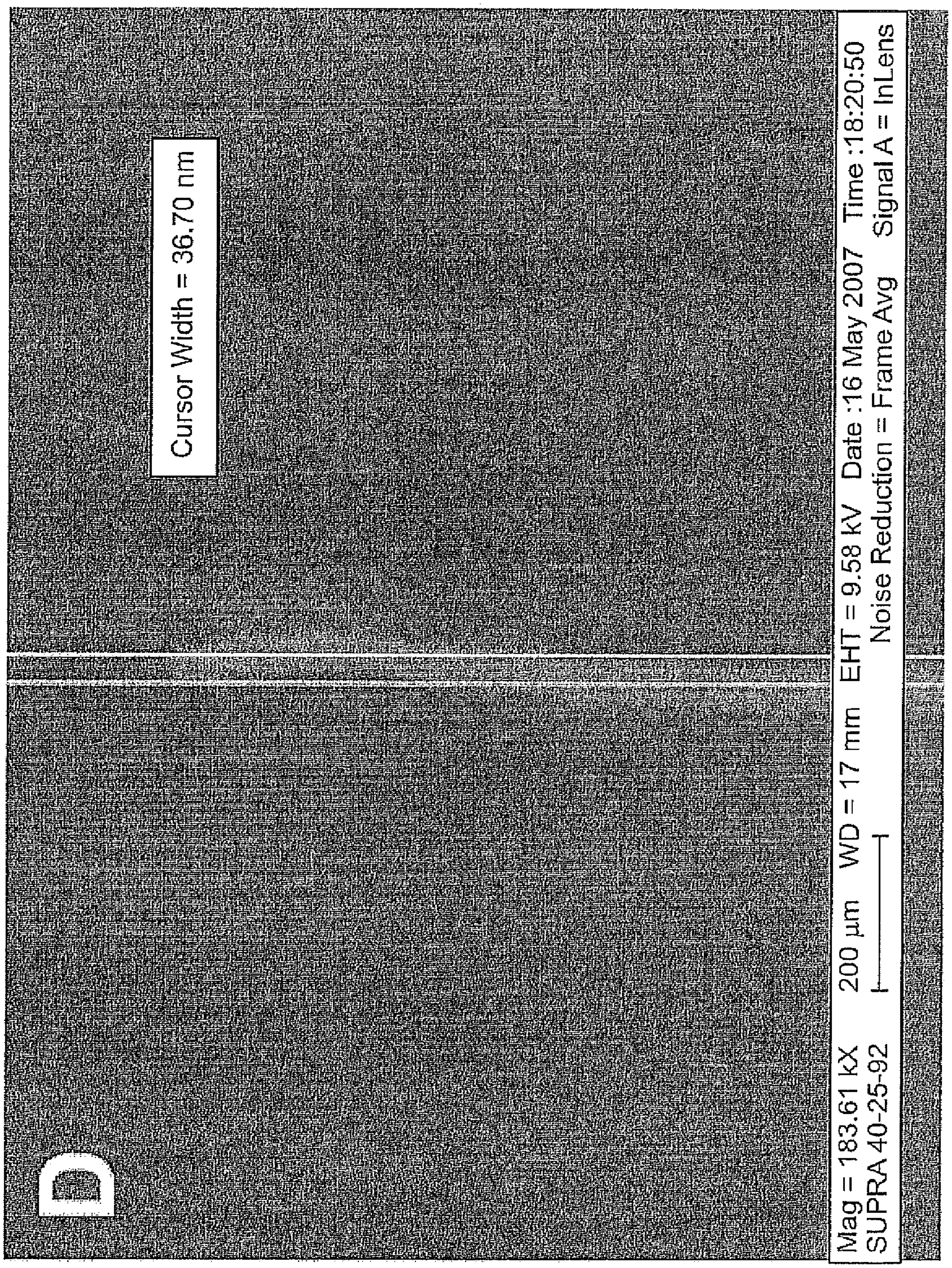

FIGS. 12A-12D show the fabricated CNF FEAs, and in particular FIG. 12A shows a 1 cm×1 cm CNF FEA on top of 100 μm-tall silicon columns, 10 μm column pitch and FIG. 12B shows a local isolated CNF FEA on top of un-gated FETs. FIG. 12C shows an isolated 4 μm-tall CNF on top of un-gated FETs and FIG. 12D shows a CNF tip—tip diameter equal to 36 μm. The PECVD CNF FEAs are fabricated by replacing the thin film stack previously described by a Ni/TiN structure and using RIE to pattern the TiN and wet etching to pattern the Ni film, as shown in FIGS. 12A-12D. CNFs were grown using the Ni pads as catalyst in a PECVD reactor that uses ammonia and acetylene.

Figure 13A:
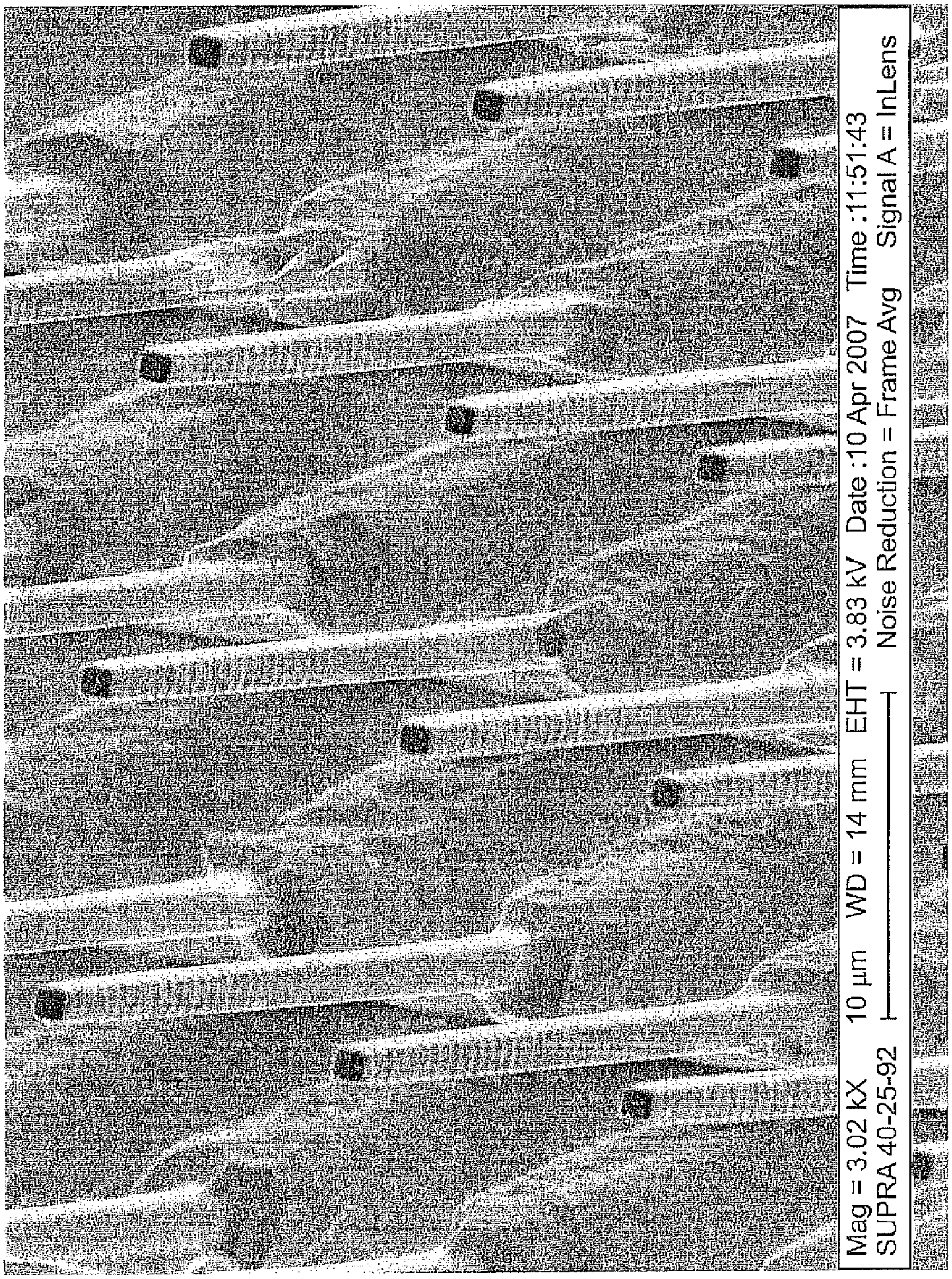
FIGS. 13A-13B are SEM illustrating fabrication of the silicon column (pillar) un-gated FET for metallization testing.
Figure 13B:
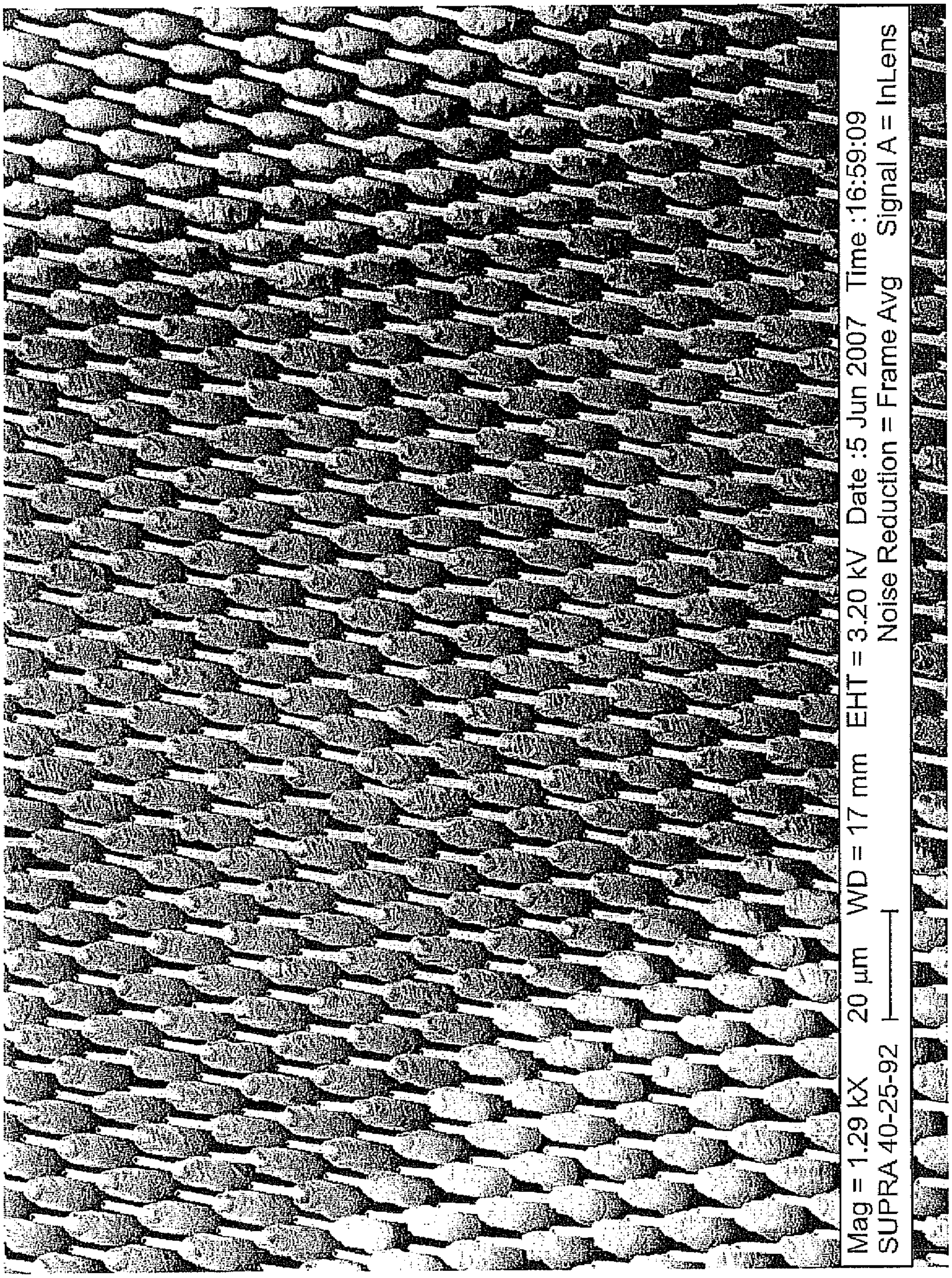

FIGS. 13A-13B show the fabrication of contact metallization for testing the vertical silicon pillar (column) un-gated FETs. The silicon columns are oxidized and coated with PECVD oxide. Then, column tips are released with BOE as shown in FIG. 13A. Al and Ti are sputtered on the silicon columns (FETs) using a shadow mask with a grid pattern to make electrical contact for testing as shown in FIG. 13B. To test the un-gated FETs, the structures shown in FIG. 10 received PECVD oxide deposition, to isolate the FETs, followed by BOE dip, to expose the top of the FETs, and Al/Ti metallization, as shown FIGS. 13A-13B. The samples were annealed at 380° C. in a forming gas atmosphere.

Figure 14:
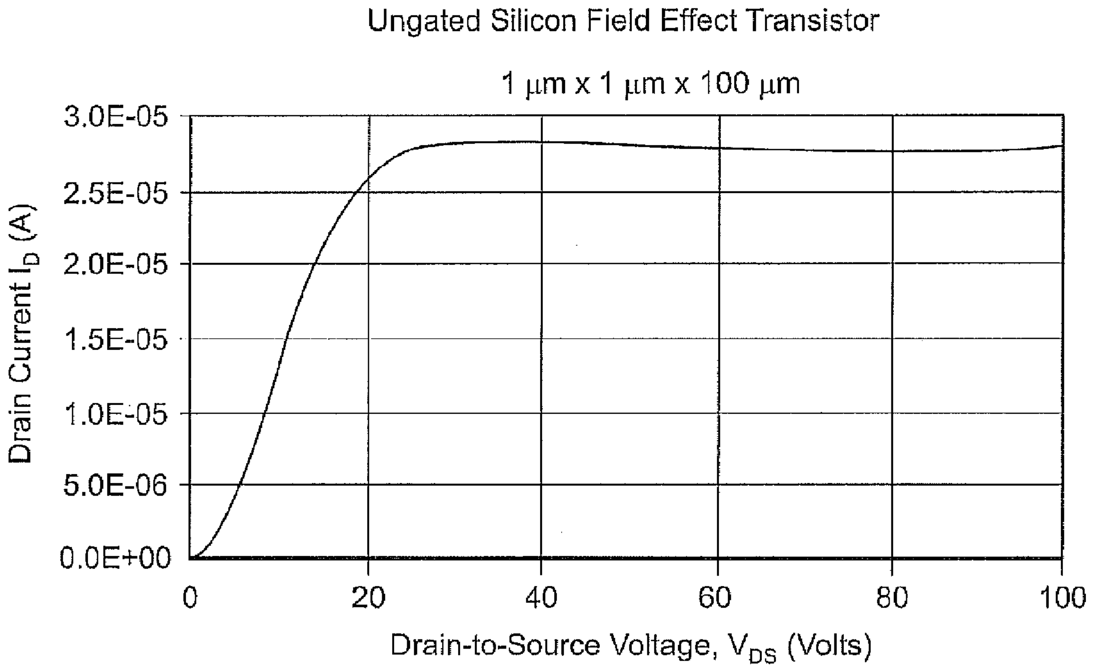
FIG. 14 is a graph illustrating the current-voltage characteristics of the silicon column (pillar) un-gated FET demonstrating that current saturation is achieved.
Figure 15:
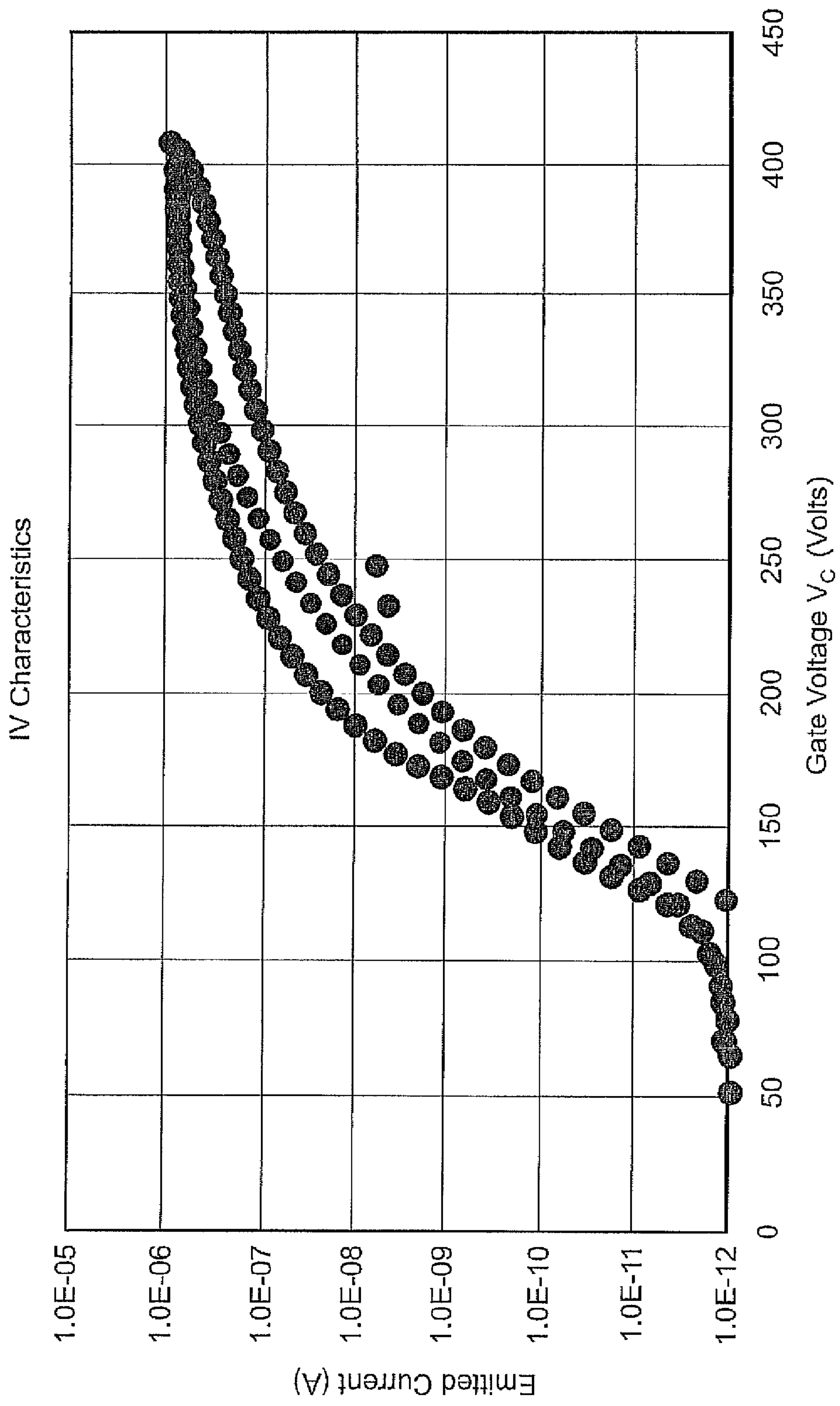
FIG. 15 is a graph illustrating that field emission currents saturate at high voltages due to ballasting of the un-gated FETs.
Figure 16:
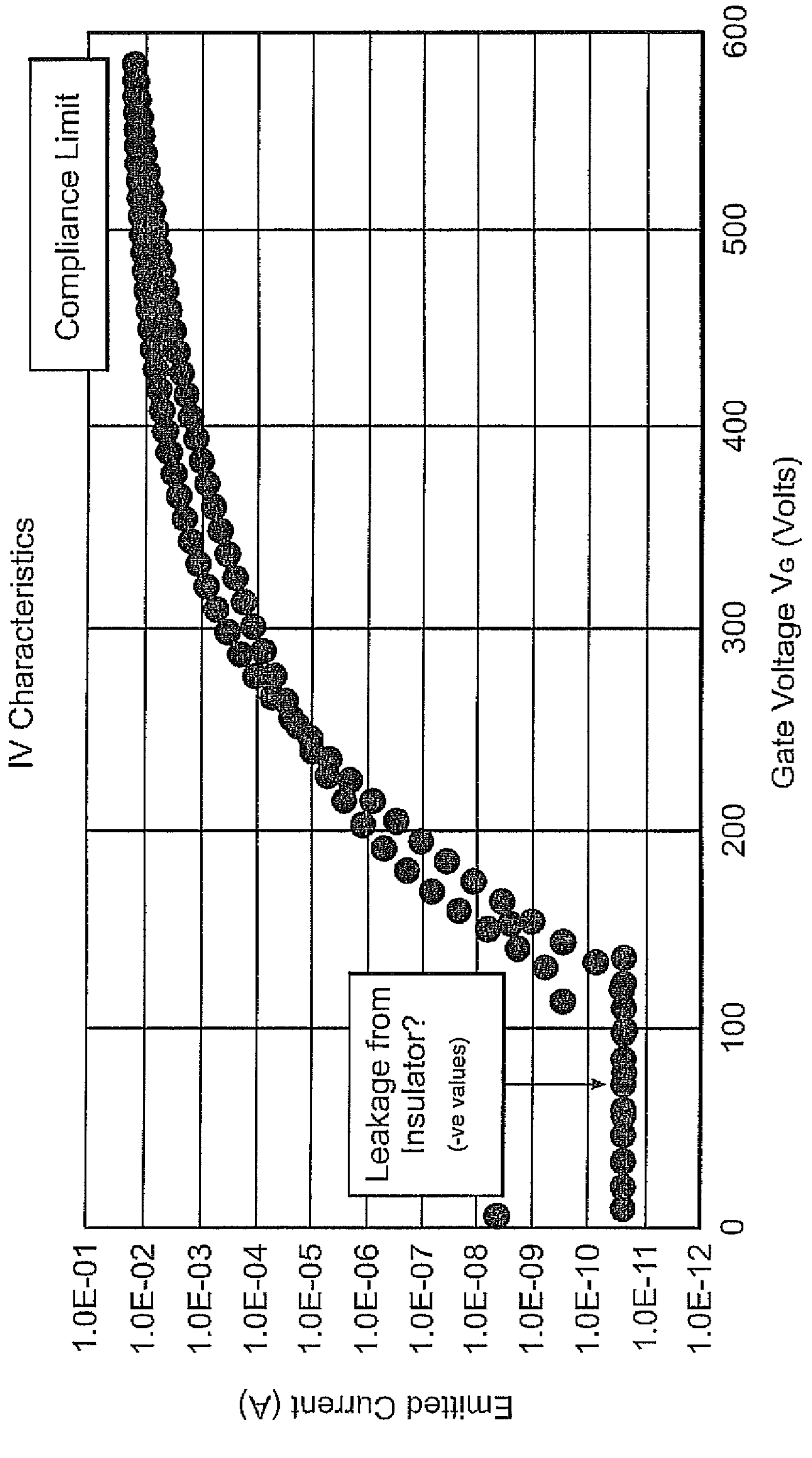
FIG. 16 is a graph characterizing the large arrays ($10^6$ emitters) of the integrated inventive device having an emission current of 10 mA.

Un-gated FET characteristics show current source-like behavior consistent with device simulation, as shown in FIG. 14. For a doping concentration of $10^{15}$ $cm^{-3}$ a linear conductance $gi_{iN}$ of to 2 μS is experimentally obtained while simulations predict a value equal to 0.6 μS. The saturation voltage $V_{DSS}$ is estimated at 30 V, in good agreement with the simulations. Simulations also predict an output resistance $r_o$ equal to 100 mega-ohm, while experimentally a flat IV profile is obtained for voltages substantially larger than $V_{DSS}$. However, the experimental data show some non-ideal characteristics such as poor ohmic contact resistance (related to the way the metallization was conducted) and negative output conductance at medium voltages. Small arrays (60×70) of the integrated device fabricated on 150-250 Ω-cm n-Si substrates show that emission currents saturate at high voltages due to ballasting of the un-gated FETs, as shown in FIG. 15. The emission current per tip is consistent with the saturation currents of the un-gated FET. FIG. 16 is a graph characterizing the large arrays ($10^6$ emitters) of the integrated inventive device having an emission current of 10 mA. The emission current was only limited by the compliance of the equipment.

Figure 17:
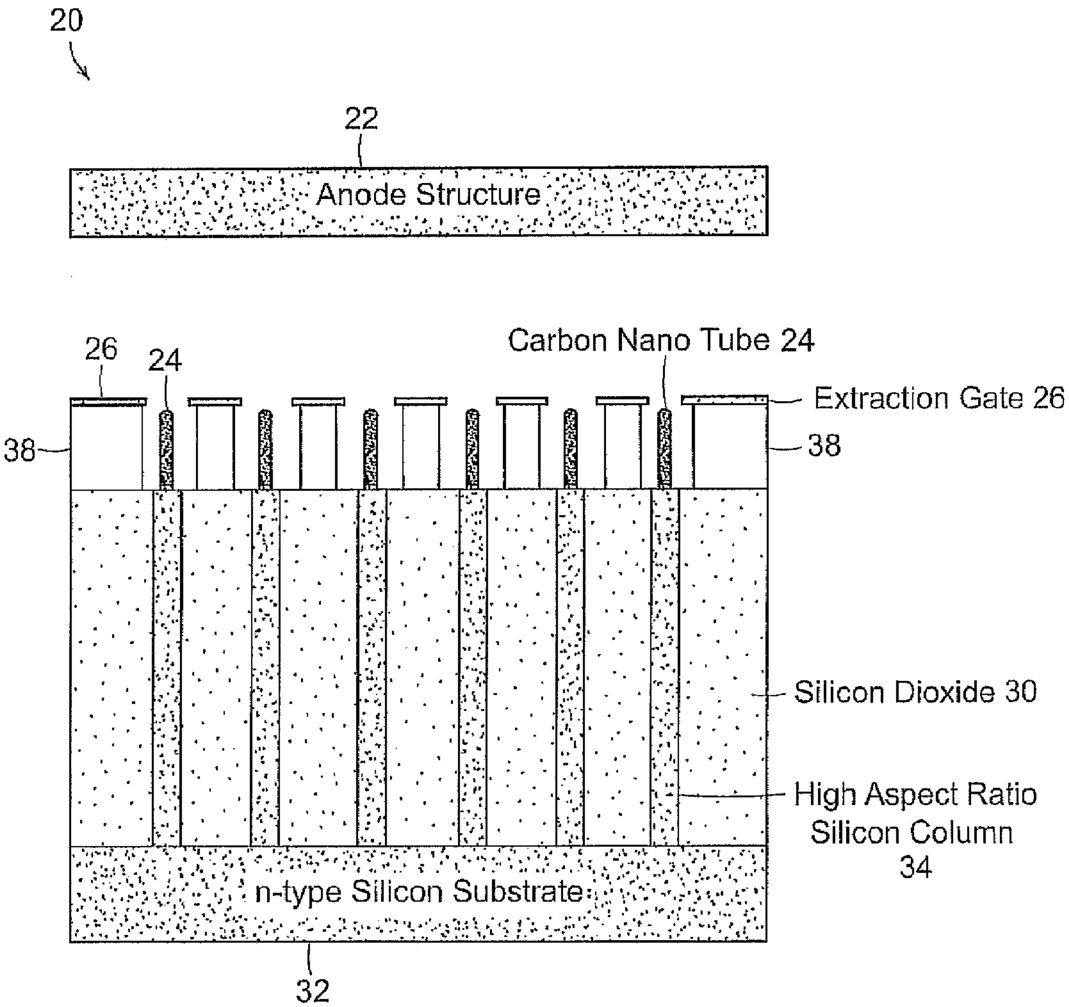
FIG. 17 is a schematic diagram of a third embodiment of the invention.

A third embodiment of the inventive emission array structure 20 is shown in FIG. 17. The structure 20 includes an anode structure 22 and vertically aligned carbon nano fibers 24 that are grown on high aspect ratio semiconductor column/pillars defined by deep reactive ion etching (DRIE) to form vertical un-gated FETs 34, each separated by a multitude of filled trenches 30, on n-type silicon substrates 32 as indicated in FIG. 17. Also, the structure includes a multitude of extraction gate structures 26 that are formed on a plurality of insulating structures 38. The insulating structures 38 are formed on the top regions of each of the filled trenches 30. The insulating structures 38 and filled trench 30 can include silicon dioxide or other oxide based materials. The structure 20 incorporates a multitude of vertical un-gated silicon FETs 34 as vertical current limiters that prevents Joule heating and thermal run-away. The un-gated silicon FETs 34 are biased in its high dynamic resistance region and it essentially provides negative feedback to the CNFs 24, which form field emitters for the un-gated silicon FET 34. Each field emitter 24 is individually ballasted by an un-gated FET 34 formed from the semiconductor column/pillars. In this embodiment of the invention, the field emitters 24 include silicon or carbon nanotube/fiber and the un-gated FETs 34 includes silicon, however, other similar materials can be used.

The CNFs 24 do not have uniform radii distribution but the addition of the un-gated silicon FET (VCT) in its emitter circuit results in uniform distribution of the current over the cathode. The net effect of the ballasting structure is to allow the application of a large enough extraction gate voltage to turn-on the "dullest" tips (larger tip radii) while limiting the current in the "sharpest" tips and hence prevent thermal run away. A higher overall emission current results because a higher percentage of the tips are emitting (and uniformly) because the current through each tip is limited by a current source.

Figure 18A:
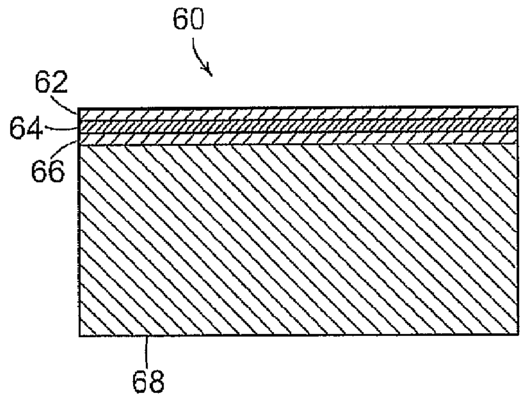
FIGS. 18A-18H are process flow graphs illustrating the fabrication of an array of field emitters formed in accordance with the invention.
Figure 18B:
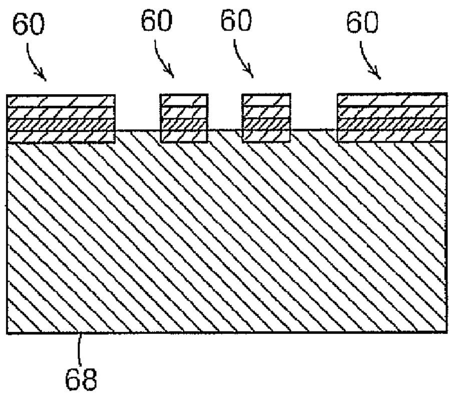
Figure 18C:
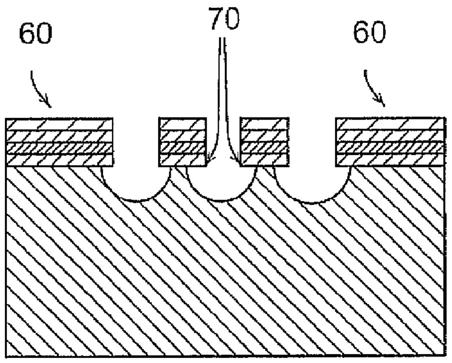
Figure 18D:
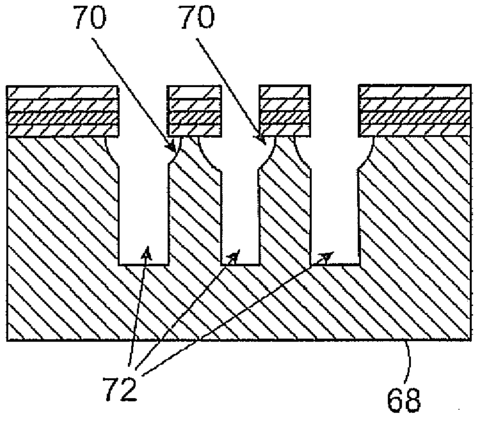
Figure 18E:
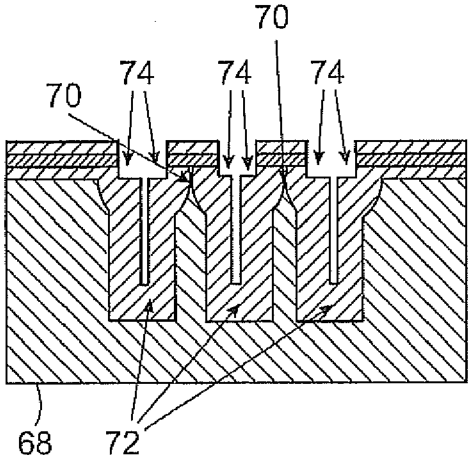

FIGS. 18A-18H illustrate a process flow used in the fabrication of an array of field emitters, described herein, formed in accordance with the invention. The fabrication of the array of field emitters individually ballasted with an un-gated field effect transistor (FET) structure starts with the deposition of a dielectric thin-film stack 60 comprising a 0.5 μm thermal silicon dioxide ($SiO_2$) layer 62, a 0.5 μm silicon-rich silicon nitride layer 64, and a 0.5 μm low pressure chemical vapor deposited (LPCVD) silicon dioxide ($SiO_2$) layer 66 on an n-type silicon (n-Si) substrate 68, as shown in FIG. 18A. The film depositions are followed by photolithography and the thin-film stacks 60 are patterned using reactive ion etching (RIE), as shown in FIG. 18B. Silicon field emitter tips 70 are formed using a modified DRIE step but could also be formed using an RIE step, as shown in FIG. 18C. The n-Si substrate 68 is further etched using deep reactive ion etching (DRIE) to form high aspect ratio silicon columns 72 as shown in FIG. 18D. This is followed by wet oxidation to further consume the silicon and improve the aspect ratio as well as fill the gap between the columns 72 with thick silicon dioxide layers 74, as shown in FIG. 18E. Tip sharpening occurs during the oxidation step that increases the aspect ratio while at the same time filling the gap between the columns 72 as shown in FIG. 18E.

In order to fabricate carbon nano tubes/fibers (CNT/CNF) the thin-film stacks 60 previously described are replaced by a Ni/TiN structure and RIE is used to pattern the TiN and wet etch to pattern the Ni film. CNTs/CNFs are grown using the Ni pads as catalyst in a PECVD reactor that uses ammonia and acetylene.

Figure 18F:
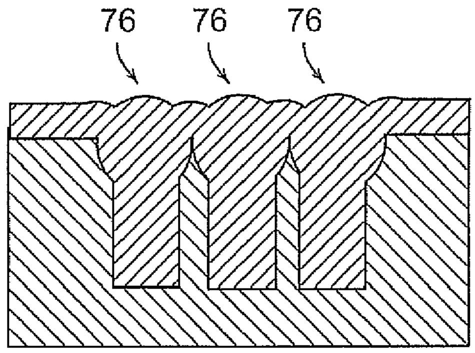

After the formation of the Si or CNT/CNF tips, the thin-film dielectric stacks 60 are stripped by wet etches. Next, additional silicon dioxide layers 76 are deposited by LPCVD to completely fill the gap between the columns, as shown in FIG. 18F. For the Si field emitters 70, this could also be accomplished by depositing polysilicon layers and then consuming the polysilicon layers by wet oxidation and then followed by the deposition low temperature oxide (LTO).

Figure 18G:
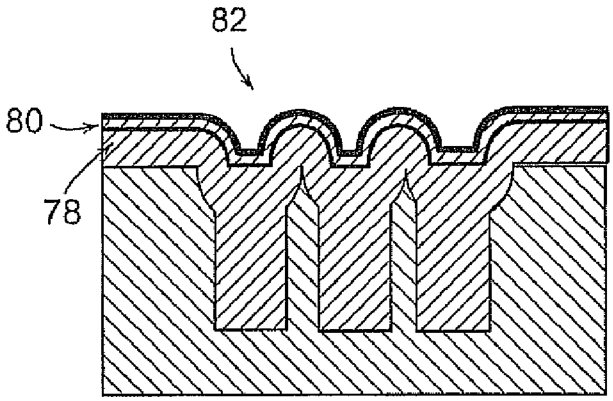

In order to form the gates of the field emitters, a stack of PECVD films having of a 0.5 μm doped amorphous Si layer 82, a 1 μm of silicon dioxide layer 80, and another 0.5 μm doped amorphous Si layer 78 being deposited by plasma enhanced chemical vapor deposition (PECVD), as shown in FIG. 18G. Next, the gates are defined to separate devices. This requires another photolithography step and reactive ion etches for amorphous silicon and silicon dioxide.

Figure 18H:
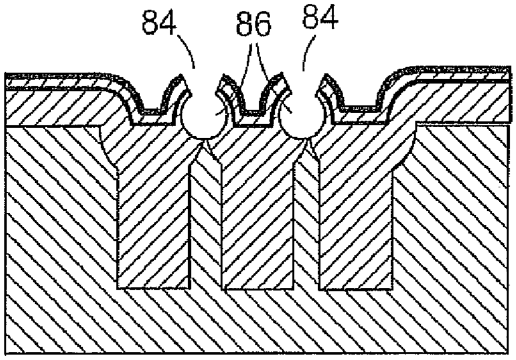

The gate apertures 84 are opened, as shown in FIG. 18H, by one of three techniques. The first approach spins photoresist to planarize the structure (and this may include a photoresist reflow step), followed by reactive ion etching of amorphous silicon, wet oxide etch in buffered oxide etch (BOE) and then another reactive ion etching of amorphous silicon. The final exposure of the Si tip 86 is accomplished by etching the remaining oxide in BOE. The second approach planarizes the amorphous silicon layer 82 by chemical mechanical polishing and in the processes open aperture of the gates 84. The final step is tip 86 exposure using BOE. The third approach directly defines gates 84 using projection lithography in a stepper after wafer planarization followed by RIE of the film stack and then exposure of the tips 86 in BOE.

The invention includes the first dense ($10^6$ emitters), high current (10 mA) array of individually ballasted field emitters that use un-gated FETs as current limiters. The results show that the emission current is limited by the ballasting un-gated FETs. This work represents four key contributions: (1) Vertical un-gated FETs with high aspect ratio (length-to-column width >100) were fabricated, tested, and clearly demonstrated current saturation and that vertical FETs enable large FEA density. (2) Isolated PECVD CNFs/Si tips were formed on top of high aspect ratio Si columns allowing FEs to be individually ballasted. (3) The integrated device produced the highest reported field emitted current from silicon. (4) The device demonstrates a technique for ballasting high current FEAs using the saturation velocity of electrons at high fields.

Although the present invention has been shown and described with respect to several preferred embodiments thereof, various changes, omissions and additions to the form and detail thereof, may be made therein, without departing from the spirit and scope of the invention.

What is claimed is:

1. A field emitter structure comprising:

a vertical un-gated transistor structure formed on a conducting substrate, said conducting substrate comprising a vertical pillar structure to define said vertical un-gated transistor structure, wherein said conducting substrate is etched to fill a gap between said vertical pillar structure with a plurality of dielectric layers;

an emitter structure formed on said vertical un-gated transistor structure, said emitter structure is positioned in a ballasting fashion on said vertical un-gated transistor structure so as to allow said vertical un-gated transistor to provide high dynamic resistance with large saturation currents.

2. A field emitter array structure comprising:

a plurality of vertical un-gated transistor structures formed on a conducting substrate, said conducting substrate comprising a plurality of vertical pillar structures to define said vertical un-gated transistor structures, wherein said conducting substrate is etched to fill a gap between said vertical pillar structure with a plurality of dielectric layers;

a plurality of emitter structures formed on the said vertical un-gated transistor structures, each of said emitter structures is positioned in a ballasting fashion on one of said vertical un-gated transistor structures so as to allow said vertical un-gated field effect transistor structures to provide high dynamic resistance with large saturation currents.

3. The field emitter array structure of claim 2 further comprising a plurality of gate structures associated with each of said emitter structures.

4. The field emitter array structure of claim 2, wherein said emitter structures comprise of carbon or Si nanotubes or Si.

5. The field emitter array structure of claim 2, wherein each of said vertical un-gated transistor structures are separated by a filled oxide trench.

6. The field emitter array structure of claim 2, wherein said conducting substrate comprises a n-type silicon substrate.

7. The field emitter array structure of claim 2, wherein said vertical un-gated transistor structures behave similarly to a current limiter.

8. The field emitter array structure of claim 2 further comprising an anode structure coupled to said field emitter array structure.

9. The field emitter array structure of claim 2, said vertical pillar structures comprise Si.

10. The field emitter array structure of claim 2, wherein said vertical un-gated transistor structures comprise vertical un-gated FET structures.

11. The field emitter array structure of claim 2, wherein said vertical un-gated FET structures behave similarly to current sources.

12. A method of forming a field emitter array structure comprising:

forming a plurality of vertical un-gated transistor structures on a conducting substrate, said conducting substrate comprising a plurality of vertical pillar structures to define said vertical un-gated transistor structures, wherein said conducting substrate is etched to fill a gap between said vertical pillar structure with a plurality of dielectric layers; and forming a plurality of emitter structures on said vertical un-gated transistor structures, each of said emitter structures is positioned in a ballasting fashion on one of said vertical un-gated transistor structures so as to allow said vertical un-gated transistor structure to provide high dynamic resistance with large saturation currents.

13. The method of claim 12 further comprising a plurality of gate structures associated with each of said emitter structures.

14. The method of claim 12, wherein said emitter structures comprise of carbon or Si nanotubes or Si.

15. The method of claim 12, wherein each of said vertical un-gated transistor structures are separated by an oxide filled trench.

16. The method of claim 12, wherein said conducting substrate comprises a n-type silicon substrate.

17. The method of claim 12, wherein said vertical un-gated transistor structures behave similarly to a current limiter.

18. The method of claim 12 further comprising an anode structure coupled to said field emitter array structure.

19. The method of claim 12, said vertical pillar structures comprise Si.

20. The method of claim 12, wherein said vertical un-gated transistor structures comprise vertical un-gated FET structures.

21. The method of claim 12, wherein said vertical un-gated FET structures behave similarly to current sources.

* * * * *